US012751323B2

(12) United States Patent
Uzoh

(10) Patent No.: US 12,751,323 B2
(45) Date of Patent: Sep. 29, 2026

(54) DIRECT BONDING METHODS AND STRUCTURES

(71) Applicant: ADEIA SEMICONDUCTOR BONDING TECHNOLOGIES INC., San Jose, CA (US)

(72) Inventor: Cyprian Emeka Uzoh, San Jose, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 652 days.

(21) Appl. No.: 18/179,126

(22) Filed: Mar. 6, 2023

(65) Prior Publication Data

US 2024/0304593 A1 Sep. 12, 2024

(51) Int. Cl.
*H01L 21/00* (2006.01)
*H10W 90/00* (2026.01)
(Continued)

(52) U.S. Cl.
CPC ........ *H10W 90/00* (2026.01); *H10W 72/0198* (2026.01); *H10W 72/941* (2026.01);
(Continued)

(58) Field of Classification Search
CPC ......... H01L 24/80; H01L 24/05; H01L 24/06; H01L 24/08; H01L 24/94; H01L 24/97; H01L 25/0657; H01L 25/50; H01L 2224/05647; H01L 2224/06181; H01L 2224/08145; H01L 2224/80009; H01L 2224/8357; H01L 2224/80379; H01L 2224/80895; H01L 2224/80896;
(Continued)

(56) References Cited

U.S. PATENT DOCUMENTS

| | | | |
|---|---|---|---|
| 3,423,823 | A | 1/1969 | Ansley |
| 3,488,834 | A | 1/1970 | Baird |

(Continued)

FOREIGN PATENT DOCUMENTS

| | | | |
|---|---|---|---|
| CA | 2 399 282 | A1 | 8/2001 |
| CN | 113451246 | A | 9/2021 |

(Continued)

OTHER PUBLICATIONS

Abe et al., "Bonded SOI wafers with various substrates for IC fabrication," Proceedings of the Second International Symposium on Semiconductor Wafer Bonding: Science, Technology and Applications, The Electrochemical Society Proceedings, vol. 93-29 (1993), pp. 32-42.

(Continued)

*Primary Examiner* — Niki H Nguyen
(74) *Attorney, Agent, or Firm* — Knobbe, Martens, Olson & Bear, LLP

(57) ABSTRACT

Disclosed herein are processes and methods for direct bonding. In some embodiments, the process includes providing an element having a dielectric bonding surface and one or more conductive features exposed at the dielectric bonding surface, where the dielectric bonding surface has a planarity suitable for direct bonding. The process also includes, after providing the element, exposing the dielectric bonding surface to the products of a water vapor plasma prior to direct bonding the element.

18 Claims, 13 Drawing Sheets

(51) Int. Cl.

| | |
|---|---|
| *H10W 72/00* | (2026.01) |
| *H10W 72/90* | (2026.01) |
| *H10W 80/00* | (2026.01) |
| *H10W 90/26* | (2026.01) |

(52) U.S. Cl.
CPC ........ *H10W 72/944* (2026.01); *H10W 72/951* (2026.01); *H10W 72/952* (2026.01); *H10W 80/011* (2026.01); *H10W 80/016* (2026.01); *H10W 80/301* (2026.01); *H10W 80/312* (2026.01); *H10W 80/327* (2026.01); *H10W 90/26* (2026.01); *H10W 90/792* (2026.01)

(58) Field of Classification Search
CPC ............. H01L 2224/94; H01L 2224/97; H01L 2225/06565; H01L 2924/01006; H01L 2924/01014; H01L 2924/04642; H01L 2924/0504; H01L 2924/05494; H01L 2924/059; H01L 2924/01029; H01L 2224/32225; H01L 2223/54426; H01L 2225/06541; H01L 25/0655; H01L 2224/16227; H01L 21/2007; H01L 25/18; H01L 2221/68327; H01L 2224/0401; H01L 2224/80357; H01L 24/74; H01L 24/02; H01L 2224/05564; H01L 2224/75252
See application file for complete search history.

(56) References Cited

U.S. PATENT DOCUMENTS

| | | | |
|---|---|---|---|
| 3,508,980 | A | 4/1970 | Jackson, Jr. et al. |
| 3,534,467 | A | 10/1970 | Sachs et al. |
| 3,579,391 | A | 5/1971 | Buie |
| 3,587,166 | A | 6/1971 | Alexander et al. |
| 3,602,981 | A | 9/1971 | Kooi |
| 3,607,466 | A | 9/1971 | Miyazaki |
| 3,640,807 | A | 2/1972 | Van Dijk |
| 3,647,581 | A | 3/1972 | Mash |
| 3,888,708 | A | 6/1975 | Wise et al. |
| 4,416,054 | A | 11/1983 | Thomas et al. |
| 4,500,905 | A | 2/1985 | Shibata |
| 4,612,083 | A | 9/1986 | Yasumoto et al. |
| 4,617,160 | A | 10/1986 | Belanger et al. |
| 4,649,630 | A | 3/1987 | Boland et al. |
| 4,700,466 | A | 10/1987 | Nakagawa et al. |
| 4,754,544 | A | 7/1988 | Hanak |
| 4,829,018 | A | 5/1989 | Wahlstrom |
| 4,935,386 | A | 6/1990 | Nakagawa et al. |
| 4,962,879 | A | 10/1990 | Goesele et al. |
| 4,963,505 | A | 10/1990 | Fujii et al. |
| 4,970,175 | A | 11/1990 | Haisma et al. |
| 4,971,925 | A | 11/1990 | Alexander et al. |
| 4,978,421 | A | 12/1990 | Bassous et al. |
| 4,983,251 | A | 1/1991 | Haisma et al. |
| 4,992,847 | A | 2/1991 | Tuckerman |
| 5,007,071 | A | 4/1991 | Nakano et al. |
| 5,024,723 | A | 6/1991 | Goesele et al. |
| 5,034,343 | A | 7/1991 | Rouse et al. |
| 5,070,026 | A | 12/1991 | Greenwald et al. |
| 5,071,792 | A | 12/1991 | Van Vonno et al. |
| 5,081,061 | A | 1/1992 | Rouse et al. |
| 5,087,585 | A | 2/1992 | Hayashi |
| 5,089,431 | A | 2/1992 | Slatter et al. |
| 5,121,706 | A | 6/1992 | Nichols et al. |
| 5,162,251 | A | 11/1992 | Poole et al. |
| 5,183,783 | A | 2/1993 | Ohta et al. |
| 5,196,375 | A | 3/1993 | Hoshi |
| 5,234,860 | A | 8/1993 | Gluck |
| 5,236,118 | A | 8/1993 | Bower et al. |
| 5,238,875 | A | 8/1993 | Ogino |
| 5,264,113 | A | 11/1993 | Bartak et al. |
| 5,266,412 | A | 11/1993 | Bartak et al. |
| 5,266,511 | A | 11/1993 | Takao |
| 5,266,824 | A | 11/1993 | Abe et al. |
| 5,270,259 | A | 12/1993 | Ito et al. |
| 5,270,261 | A | 12/1993 | Bertin et al. |
| 5,272,104 | A | 12/1993 | Schrantz et al. |
| 5,321,301 | A | 6/1994 | Sato et al. |
| 5,324,365 | A | 6/1994 | Niwa |
| 5,324,687 | A | 6/1994 | Wojnarowski |
| 5,344,524 | A | 9/1994 | Sharma et al. |
| 5,354,695 | A | 10/1994 | Leedy |
| 5,362,659 | A | 11/1994 | Cartagena |
| 5,362,667 | A | 11/1994 | Linn et al. |
| 5,376,579 | A | 12/1994 | Annamalai |
| 5,380,681 | A | 1/1995 | Hsu |
| 5,383,993 | A | 1/1995 | Katada et al. |
| 5,394,303 | A | 2/1995 | Yamaji |
| 5,407,506 | A | 4/1995 | Goetz et al. |
| 5,407,856 | A | 4/1995 | Quenzer et al. |
| 5,413,952 | A | 5/1995 | Pages et al. |
| 5,413,955 | A | 5/1995 | Lee et al. |
| 5,420,043 | A | 5/1995 | Niwa |
| 5,420,449 | A | 5/1995 | Oji |
| 5,421,953 | A | 6/1995 | Nagakubo et al. |
| 5,422,302 | A | 6/1995 | Yonehara et al. |
| 5,427,638 | A | 6/1995 | Goetz et al. |
| 5,432,729 | A | 7/1995 | Carson et al. |
| 5,441,591 | A | 8/1995 | Imthurn et al. |
| 5,441,911 | A | 8/1995 | Malhi |
| 5,451,547 | A | 9/1995 | Himi et al. |
| 5,459,104 | A | 10/1995 | Sakai |
| 5,460,659 | A | 10/1995 | Krut |
| 5,485,540 | A | 1/1996 | Eda |
| 5,489,554 | A | 2/1996 | Gates |
| 5,497,033 | A | 3/1996 | Filion et al. |
| 5,503,704 | A | 4/1996 | Bower et al. |
| 5,514,235 | A | 5/1996 | Mitani et al. |
| 5,516,727 | A | 5/1996 | Broom |
| 5,517,057 | A | 5/1996 | Beilstein et al. |
| 5,517,754 | A | 5/1996 | Beilstein et al. |
| 5,523,602 | A | 6/1996 | Horiuchi et al. |
| 5,534,465 | A | 7/1996 | Frye et al. |
| 5,543,648 | A | 8/1996 | Miyawaki |
| 5,546,494 | A | 8/1996 | Eda |
| 5,547,896 | A | 8/1996 | Linn et al. |
| 5,548,178 | A | 8/1996 | Eda et al. |
| 5,561,303 | A | 10/1996 | Schrantz et al. |
| 5,563,084 | A | 10/1996 | Ramm et al. |
| 5,565,384 | A | 10/1996 | Havemann |
| 5,567,657 | A | 10/1996 | Wojnarowski et al. |
| 5,569,620 | A | 10/1996 | Linn et al. |
| 5,578,501 | A | 11/1996 | Niwa |
| 5,580,407 | A | 12/1996 | Haisma et al. |
| 5,591,678 | A | 1/1997 | Bendik et al. |
| 5,627,106 | A | 5/1997 | Hsu |
| 5,647,932 | A | 7/1997 | Taguchi et al. |
| 5,650,353 | A | 7/1997 | Yoshizawa et al. |
| 5,652,436 | A | 7/1997 | Stoner et al. |
| 5,653,019 | A | 8/1997 | Bernhardt et al. |
| 5,661,316 | A | 8/1997 | Kish, Jr. et al. |
| 5,661,901 | A | 9/1997 | King |
| 5,666,706 | A | 9/1997 | Tomita et al. |
| 5,668,057 | A | 9/1997 | Eda et al. |
| 5,672,240 | A | 9/1997 | Stoner et al. |
| 5,673,478 | A | 10/1997 | Beene et al. |
| 5,698,471 | A | 12/1997 | Namba et al. |
| 5,728,624 | A | 3/1998 | Linn et al. |
| 5,741,733 | A | 4/1998 | Bertagnolli et al. |
| 5,747,857 | A | 5/1998 | Eda et al. |
| 5,753,529 | A | 5/1998 | Chang et al. |
| 5,753,536 | A | 5/1998 | Sugiyama et al. |
| 5,753,975 | A | 5/1998 | Matsuno |
| 5,755,914 | A | 5/1998 | Yonehara |
| 5,759,753 | A | 6/1998 | Namba et al. |
| 5,760,478 | A | 6/1998 | Bozso et al. |
| 5,763,318 | A | 6/1998 | Bertin et al. |
| 5,766,984 | A | 6/1998 | Ramm et al. |
| 5,771,555 | A | 6/1998 | Eda et al. |
| 5,783,477 | A | 7/1998 | Kish, Jr. et al. |
| 5,785,874 | A | 7/1998 | Eda et al. |

(56) References Cited

U.S. PATENT DOCUMENTS 5,793,115 A 8/1998 Zavracky et al.
5,804,086 A 9/1998 Bruel
5,807,783 A 9/1998 Gaul et al.
5,821,665 A 10/1998 Onishi et al.
5,841,197 A 11/1998 Adamic, Jr.
5,849,627 A 12/1998 Linn et al.
5,851,894 A 12/1998 Ramm
5,858,876 A 1/1999 Chew
5,866,942 A 2/1999 Suzuki et al.
5,869,354 A 2/1999 Leedy
5,872,025 A 2/1999 Cronin et al.
5,876,497 A 3/1999 Atoji
5,877,034 A 3/1999 Ramm et al.
5,877,070 A 3/1999 Goesele et al.
5,877,516 A 3/1999 Mermagen et al.
5,880,010 A 3/1999 Davidson
5,889,302 A 3/1999 Liu
5,902,118 A 5/1999 Hubner
5,903,018 A 5/1999 Shimawaki
5,904,860 A 5/1999 Nagakubo et al.
5,910,699 A 6/1999 Namba et al.
5,915,167 A 6/1999 Leedy
5,915,193 A 6/1999 Tong et al.
5,920,142 A 7/1999 Onishi et al.
5,936,280 A 8/1999 Liu
5,966,622 A 10/1999 Levine et al.
5,980,770 A 11/1999 Ramachandran et al.
5,982,010 A 11/1999 Namba et al.
5,985,412 A 11/1999 Gosele
5,990,472 A 11/1999 Rinne
5,990,562 A 11/1999 Vallett
5,991,989 A 11/1999 Onishi et al.
6,004,865 A 12/1999 Horiuchi et al.
6,004,866 A 12/1999 Nakano et al.
6,018,211 A 1/2000 Kanaboshi et al.
6,048,752 A 4/2000 Linderman
6,054,369 A 4/2000 Neilson et al.
6,054,371 A 4/2000 Tsuchiaki et al.
6,071,761 A 6/2000 Jacobs
6,080,487 A 6/2000 Coggio et al.
6,080,640 A 6/2000 Gardner et al.
6,087,719 A 7/2000 Tsunashima
6,087,760 A 7/2000 Yamaguchi et al.
6,097,096 A 8/2000 Gardner et al.
6,103,009 A 8/2000 Atoji
6,106,653 A 8/2000 Polizzotti et al.
6,120,917 A 9/2000 Eda
6,133,640 A 10/2000 Leedy
6,136,691 A 10/2000 Chen
6,143,628 A 11/2000 Sato et al.
6,146,992 A 11/2000 Lauterbach et al.
6,153,445 A 11/2000 Yamazaki et al.
6,153,495 A 11/2000 Kub et al.
6,154,940 A 12/2000 Onishi et al.
6,156,624 A 12/2000 Yamagata et al.
6,159,767 A 12/2000 Eichelberger
6,165,817 A 12/2000 Akram et al.
6,180,496 B1 1/2001 Farrens et al.
6,190,778 B1 2/2001 Batz-Sohn et al.
6,194,323 B1 2/2001 Downey et al.
6,197,663 B1 3/2001 Chandross et al.
6,198,159 B1 3/2001 Hosoma et al.
6,204,079 B1 3/2001 Aspar et al.
6,236,141 B1 5/2001 Sato et al.
6,242,324 B1 6/2001 Kub et al.
6,246,068 B1 6/2001 Sato et al.
6,255,731 B1 7/2001 Ohmi et al.
6,255,899 B1 7/2001 Bertin et al.
6,270,202 B1 8/2001 Namba et al.
6,274,892 B1 8/2001 Kub et al.
6,278,174 B1 8/2001 Havemann et al.
6,313,012 B1 11/2001 Horiuchi et al.
6,316,332 B1 11/2001 Lo et al.
6,323,108 B1 11/2001 Kub et al.
6,328,796 B1 12/2001 Kub et al.
6,328,841 B1 12/2001 Klumpp et al.
6,348,706 B1 2/2002 Sandhu
6,423,640 B1 7/2002 Lee et al.
6,440,878 B1 8/2002 Yang et al.
6,448,174 B1 9/2002 Ramm
6,465,892 B1 10/2002 Suga
6,475,072 B1 11/2002 Canaperi et al.
6,497,763 B2 12/2002 Kub et al.
6,562,647 B2 5/2003 Zandman et al.
6,563,133 B1 5/2003 Tong
6,563,224 B2 5/2003 Leedy
6,613,678 B1 9/2003 Sakaguchi et al.
6,627,531 B2 9/2003 Enquist
6,645,828 B1 11/2003 Farrens et al.
6,774,461 B2 8/2004 Yeh et al.
6,864,585 B2 3/2005 Enquist
6,887,769 B2 5/2005 Kellar et al.
6,902,987 B1 6/2005 Tong et al.
6,905,557 B2 6/2005 Enquist
6,908,027 B2 6/2005 Tolchinsky et al.
6,908,832 B2 6/2005 Farrens et al.
6,909,146 B1 6/2005 Linn et al.
6,984,571 B1 1/2006 Enquist
6,989,314 B2 1/2006 Rayssac et al.
7,037,755 B2 5/2006 Enquist
7,041,178 B2 5/2006 Tong et al.
7,045,453 B2 5/2006 Canaperi et al.
7,105,980 B2 9/2006 Abbott et al.
7,109,092 B2 9/2006 Tong
7,119,400 B2 10/2006 Burden
7,126,212 B2 10/2006 Enquist et al.
7,193,423 B1 3/2007 Dalton et al.
7,335,572 B2 2/2008 Tong et al.
7,335,996 B2 2/2008 Tong
7,358,152 B2 4/2008 Kub et al.
7,387,944 B2 6/2008 Tong et al.
7,553,744 B2 6/2009 Tong et al.
7,750,488 B2 7/2010 Patti et al.
7,803,693 B2 9/2010 Trezza
7,807,549 B2 10/2010 Tong et al.
7,871,898 B2 1/2011 Tong et al.
8,053,329 B2 11/2011 Tong et al.
8,183,127 B2 5/2012 Patti et al.
8,349,635 B1 1/2013 Gan et al.
8,377,798 B2 2/2013 Peng et al.
8,441,131 B2 5/2013 Ryan
8,476,165 B2 7/2013 Trickett et al.
8,482,132 B2 7/2013 Yang et al.
8,501,537 B2 8/2013 Sadaka et al.
8,505,197 B2 8/2013 Blanchard
8,524,533 B2 9/2013 Tong et al.
8,620,164 B2 12/2013 Heck et al.
8,642,444 B2 2/2014 Fujii
8,647,987 B2 2/2014 Yang et al.
8,697,493 B2 4/2014 Sadaka
8,716,105 B2 5/2014 Sadaka et al.
8,802,538 B1 8/2014 Liu
8,809,123 B2 8/2014 Liu et al.
8,841,002 B2 9/2014 Tong
8,988,299 B2 3/2015 Kam et al.
9,093,350 B2 7/2015 Endo et al.
9,142,517 B2 9/2015 Liu
9,142,532 B2 9/2015 Suga et al.
9,171,756 B2 10/2015 Enquist et al.
9,184,125 B2 11/2015 Enquist et al.
9,224,704 B2 12/2015 Landru
9,230,941 B2 1/2016 Chen et al.
9,257,399 B2 2/2016 Kuang et al.
9,299,736 B2 3/2016 Chen et al.
9,312,229 B2 4/2016 Chen et al.
9,331,149 B2 5/2016 Tong et al.
9,337,235 B2 5/2016 Chen et al.
9,368,866 B2 6/2016 Yu
9,385,024 B2 7/2016 Tong et al.
9,391,143 B2 7/2016 Tong et al.
9,394,161 B2 7/2016 Cheng et al.
9,431,368 B2 8/2016 Enquist et al.
9,437,572 B2 9/2016 Chen et al.
9,443,796 B2 9/2016 Chou et al.

(56) References Cited

U.S. PATENT DOCUMENTS 9,461,007 B2 10/2016 Chun et al.
9,496,239 B1 11/2016 Edelstein et al.
9,536,848 B2 1/2017 England et al.
9,559,081 B1 1/2017 Lai et al.
9,620,481 B2 4/2017 Edelstein et al.
9,656,852 B2 5/2017 Cheng et al.
9,723,716 B2 8/2017 Meinhold
9,728,521 B2 8/2017 Tsai et al.
9,741,620 B2 8/2017 Uzoh et al.
9,799,587 B2 10/2017 Fujii et al.
9,852,988 B2 12/2017 Enquist et al.
9,881,882 B2 1/2018 Hsu et al.
9,893,004 B2 2/2018 Yazdani
9,899,442 B2 2/2018 Katkar
9,929,050 B2 3/2018 Lin
9,941,241 B2 4/2018 Edelstein et al.
9,941,243 B2 4/2018 Kim et al.
9,953,941 B2 4/2018 Enquist
9,960,142 B2 5/2018 Chen et al.
10,002,844 B1 6/2018 Wang et al.
10,026,605 B2 7/2018 Doub et al.
10,075,657 B2 9/2018 Fahim et al.
10,204,893 B2 2/2019 Uzoh et al.
10,269,756 B2 4/2019 Uzoh
10,276,619 B2 4/2019 Kao et al.
10,276,909 B2 4/2019 Huang et al.
10,418,277 B2 9/2019 Cheng et al.
10,434,749 B2 10/2019 Tong
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,707,087 B2 7/2020 Uzoh et al.
10,727,219 B2 7/2020 Uzoh et al.
10,784,191 B2 9/2020 Huang et al.
10,790,262 B2 9/2020 Uzoh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,037,919 B2 6/2021 Uzoh et al.
11,056,348 B2 7/2021 Theil
11,069,734 B2 7/2021 Katkar
11,088,099 B2 8/2021 Katkar et al.
11,127,738 B2 9/2021 DeLaCruz et al.
11,158,606 B2 10/2021 Gao et al.
11,169,326 B2 11/2021 Huang et al.
11,171,117 B2 11/2021 Gao et al.
11,176,450 B2 11/2021 Teig et al.
11,195,748 B2 12/2021 Uzoh et al.
11,205,625 B2 12/2021 DeLaCruz et al.
11,256,004 B2 2/2022 Haba et al.
11,264,357 B1 3/2022 DeLaCruz et al.
11,276,676 B2 3/2022 Enquist et al.
11,296,044 B2 4/2022 Gao et al.
11,329,034 B2 5/2022 Tao et al.
11,348,898 B2 5/2022 DeLaCruz et al.
11,355,443 B2 6/2022 Huang et al.
11,367,652 B2 6/2022 Uzoh et al.
11,760,059 B2 9/2023 Tong
12,424,584 B2 9/2025 Uzoh
2001/0016382 A1 8/2001 Song et al.
2002/0096760 A1 7/2002 Simelgor et al.
2002/0181827 A1 12/2002 Johnson et al.
2003/0020104 A1 1/2003 Talin et al.
2003/0057423 A1 3/2003 Shimoda et al.
2004/0009649 A1 1/2004 Kub et al.
2004/0084414 A1 5/2004 Sakai et al.
2004/0126993 A1 7/2004 Chan et al.
2004/0157407 A1 8/2004 Tong et al.
2004/0226656 A1 11/2004 Walsh et al.
2005/0110159 A1 5/2005 Oh et al.
2006/0057945 A1 3/2006 Hsu et al.
2006/0292744 A1 12/2006 Enquist et al.
2007/0096294 A1 5/2007 Ikeda et al.
2007/0111386 A1 5/2007 Kim et al.
2007/0222048 A1 9/2007 Huang
2007/0295456 A1 12/2007 Gudeman et al.
2008/0061418 A1 3/2008 Enquist et al.
2008/0061419 A1 3/2008 Enquist et al.
2008/0093747 A1 4/2008 Enquist et al.
2011/0067803 A1 3/2011 Tong et al.
2011/0290552 A1 12/2011 Palmateer et al.
2012/0077329 A1 3/2012 Broekaart et al.
2012/0212384 A1 8/2012 Kam et al.
2013/0137245 A1 5/2013 Robert
2014/0175655 A1* 6/2014 Chen ........................ H01L 24/11
228/172
2014/0225795 A1 8/2014 Yu
2015/0064498 A1 3/2015 Tong
2016/0190103 A1 6/2016 Kabe et al.
2016/0343682 A1 11/2016 Kawasaki
2017/0062366 A1 3/2017 Enquist
2017/0170132 A1 6/2017 Enquist et al.
2017/0179029 A1 6/2017 Enquist et al.
2017/0194271 A1 7/2017 Hsu et al.
2017/0200711 A1 7/2017 Uzoh et al.
2017/0338214 A1 11/2017 Uzoh et al.
2018/0096931 A1 4/2018 Huang et al.
2018/0174995 A1 6/2018 Wang et al.
2018/0175012 A1 6/2018 Wu et al.
2018/0182639 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0191047 A1 7/2018 Huang et al.
2018/0219038 A1 8/2018 Gambino et al.
2018/0226375 A1 8/2018 Enquist et al.
2018/0273377 A1 9/2018 Katkar et al.
2018/0286805 A1 10/2018 Huang et al.
2018/0323177 A1 11/2018 Yu et al.
2018/0323227 A1 11/2018 Zhang et al.
2018/0331066 A1 11/2018 Uzoh et al.
2019/0096741 A1* 3/2019 Uzoh ................ H01L 21/76856
2019/0096842 A1 3/2019 Fountain, Jr. et al.
2019/0109042 A1 4/2019 Katkar et al.
2019/0115247 A1 4/2019 Tong et al.
2019/0115277 A1 4/2019 Yu et al.
2019/0131277 A1 5/2019 Yang et al.
2019/0198407 A1 6/2019 Huang et al.
2019/0198409 A1 6/2019 Katkar et al.
2019/0265411 A1 8/2019 Huang et al.
2019/0333550 A1 10/2019 Fisch
2019/0344533 A1 11/2019 Tong
2019/0344534 A1 11/2019 Tong
2019/0348336 A1 11/2019 Katkar et al.
2019/0371761 A1 12/2019 Uzoh
2019/0385935 A1 12/2019 Gao et al.
2019/0385966 A1 12/2019 Gao et al.
2020/0006266 A1 1/2020 Chen et al.
2020/0013637 A1 1/2020 Haba
2020/0013765 A1 1/2020 Fountain, Jr. et al.
2020/0035641 A1 1/2020 Fountain, Jr. et al.
2020/0051945 A1 2/2020 Pan et al.
2020/0075520 A1 3/2020 Gao et al.
2020/0075534 A1 3/2020 Gao et al.
2020/0075553 A1 3/2020 DeLaCruz et al.
2020/0118973 A1 4/2020 Wang et al.
2020/0126906 A1 4/2020 Uzoh et al.
2020/0126945 A1 4/2020 Wang et al.

(56) References Cited

U.S. PATENT DOCUMENTS

2020/0194396 A1* 6/2020 Uzoh ...................... H01L 24/82
2020/0227367 A1 7/2020 Haba et al.
2020/0243380 A1 7/2020 Uzoh et al.
2020/0279821 A1 9/2020 Haba et al.
2020/0294908 A1 9/2020 Haba et al.
2020/0328162 A1 10/2020 Haba et al.
2020/0328164 A1 10/2020 DeLaCruz et al.
2020/0328165 A1 10/2020 DeLaCruz et al.
2020/0335408 A1 10/2020 Gao et al.
2020/0371154 A1 11/2020 DeLaCruz et al.
2020/0395321 A1 12/2020 Katkar et al.
2020/0411483 A1 12/2020 Uzoh et al.
2021/0098412 A1 4/2021 Haba et al.
2021/0118864 A1 4/2021 DeLaCruz et al.
2021/0143125 A1 5/2021 DeLaCruz et al.
2021/0175280 A1 6/2021 Chae et al.
2021/0181510 A1 6/2021 Katkar et al.
2021/0193603 A1 6/2021 Katkar et al.
2021/0193624 A1 6/2021 DeLaCruz et al.
2021/0193625 A1 6/2021 DeLaCruz et al.
2021/0202567 A1 7/2021 Kim et al.
2021/0242152 A1 8/2021 Fountain, Jr. et al.
2021/0296282 A1 9/2021 Gao et al.
2021/0305202 A1 9/2021 Uzoh et al.
2021/0366820 A1 11/2021 Uzoh
2021/0407941 A1 12/2021 Haba
2022/0077063 A1 3/2022 Haba
2022/0077087 A1 3/2022 Haba
2022/0139867 A1* 5/2022 Uzoh .................... H10W 90/00
438/107
2022/0139869 A1 5/2022 Gao et al.
2022/0208650 A1 6/2022 Gao et al.
2022/0208702 A1 6/2022 Uzoh
2022/0208723 A1 6/2022 Katkar et al.
2022/0246497 A1 8/2022 Fountain, Jr. et al.
2022/0285303 A1 9/2022 Mirkarimi et al.
2022/0319901 A1 10/2022 Suwito et al.
2022/0320035 A1 10/2022 Uzoh et al.
2022/0320036 A1 10/2022 Gao et al.
2023/0005850 A1 1/2023 Fountain, Jr.
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1 4/2023 Uzoh et al.
2023/0122531 A1 4/2023 Uzoh
2023/0123423 A1 4/2023 Gao et al.
2023/0125395 A1 4/2023 Gao et al.
2023/0130259 A1 4/2023 Haba et al.
2023/0132632 A1 5/2023 Katkar et al.
2023/0140107 A1 5/2023 Uzoh et al.
2023/0142680 A1 5/2023 Guevara et al.
2023/0154816 A1 5/2023 Haba et al.
2023/0154828 A1 5/2023 Haba et al.
2023/0187264 A1 6/2023 Uzoh et al.
2023/0187317 A1 6/2023 Uzoh
2023/0187412 A1 6/2023 Gao et al.
2023/0197453 A1 6/2023 Fountain, Jr. et al.
2023/0197496 A1 6/2023 Theil
2023/0197559 A1 6/2023 Haba et al.
2023/0197560 A1 6/2023 Katkar et al.
2023/0197655 A1 6/2023 Theil et al.
2023/0207402 A1 6/2023 Fountain, Jr. et al.
2023/0207437 A1 6/2023 Haba
2023/0207474 A1 6/2023 Uzoh et al.
2023/0207514 A1 6/2023 Gao et al.
2023/0215836 A1 7/2023 Haba et al.
2023/0245950 A1 8/2023 Haba et al.
2023/0268300 A1 8/2023 Uzoh et al.
2023/0299029 A1 9/2023 Theil et al.
2023/0343734 A1 10/2023 Uzoh et al.
2023/0360950 A1 11/2023 Gao
2023/0361074 A1 11/2023 Uzoh et al.
2023/0369136 A1 11/2023 Uzoh et al.
2023/0375613 A1 11/2023 Haba et al.
2024/0038702 A1 2/2024 Uzoh
2024/0055407 A1 2/2024 Workman
2024/0079376 A1 3/2024 Suwito et al.
2024/0105674 A1 3/2024 Uzoh et al.
2024/0170411 A1 5/2024 Chang et al.
2024/0186248 A1 6/2024 Haba et al.
2024/0186268 A1 6/2024 Uzoh et al.
2024/0186269 A1 6/2024 Haba
2024/0203917 A1 6/2024 Katkar et al.
2024/0213191 A1 6/2024 Theil et al.
2024/0213210 A1 6/2024 Haba et al.
2024/0217210 A1 7/2024 Zhao et al.
2024/0222239 A1 7/2024 Gao et al.
2024/0222315 A1 7/2024 Uzoh
2024/0222319 A1 7/2024 Gao et al.
2024/0266255 A1 8/2024 Haba et al.
2024/0298454 A1 9/2024 Haba
2024/0312951 A1 9/2024 Theil et al.
2024/0332184 A1 10/2024 Katkar et al.
2024/0332227 A1 10/2024 Uzoh et al.
2024/0332231 A1 10/2024 Uzoh
2024/0332267 A1 10/2024 Haba et al.
2024/0387419 A1 11/2024 Mrozek et al.
2025/0004197 A1 1/2025 Haba et al.
2025/0006632 A1 1/2025 Chang et al.
2025/0006642 A1 1/2025 Haba et al.
2025/0006674 A1 1/2025 Uzoh et al.
2025/0006679 A1 1/2025 Theil et al.
2025/0006689 A1 1/2025 Uzoh et al.
2025/0054854 A1 2/2025 Katkar et al.
2025/0079364 A1 3/2025 Uzoh et al.
2025/0096191 A1 3/2025 Gao et al.
2025/0112123 A1 4/2025 Katkar et al.
2025/0185163 A1 6/2025 Zhao et al.
2025/0210585 A1 6/2025 Fountain, Jr. et al.
2025/0212554 A1 6/2025 Katkar et al.
2025/0218903 A1 7/2025 Uzoh et al.
2025/0273517 A1 8/2025 Lee et al.

FOREIGN PATENT DOCUMENTS

EP 1033162 A1 9/2000
EP 1 130 647 A2 9/2001
JP 54-116888 9/1979
JP 54-155770 12/1979
JP 60-167439 8/1985
JP 61-174661 8/1986
JP 62-031138 2/1987
JP 62-283655 12/1987
JP 63-237408 10/1988
JP 63-246841 10/1988
JP 64-007548 1/1989
JP 01-259546 10/1989
JP 02-177435 7/1990
JP 03-70155 3/1991
JP 03-101128 4/1991
JP 07-161705 6/1995
JP H07-249749 9/1995
JP H07235523 A * 9/1995
JP 08-022987 1/1996
JP H08-195334 7/1996
JP H08-236695 9/1996
JP 08-298260 11/1996
JP 09-7908 1/1997
JP 09-027604 1/1997
JP 09-148321 6/1997
JP 09-330925 12/1997
JP 10-223495 8/1998
JP 10-223636 8/1998
JP 11-87203 3/1999
JP 2000-223703 8/2000
JP 2001-144273 5/2001
JP 2013-33786 2/2013
JP 2018-160519 10/2018
KR 2002-81328 10/2002
KR 10-2015-0097798 8/2015
TW 389965 B 5/2000
TW 200303846 A 9/2003

(56) References Cited

FOREIGN PATENT DOCUMENTS

| | | |
|---|---|---|
| WO | WO 96/13060 | 5/1996 |
| WO | WO 98/13860 | 4/1998 |
| WO | WO 01/61743 A1 | 8/2001 |
| WO | WO 2005/043584 A2 | 5/2005 |
| WO | WO 2006/100444 A1 | 9/2006 |
| WO | WO 2017/151442 A1 | 9/2017 |

OTHER PUBLICATIONS

Amirfeiz et al., "Formation of silicon structures by plasma activated wafer bonding," Electrochemical Society Proceedings: Semiconductor Wafer Bonding: Science, Technology, and Applications V, vol. 99-35, (1999), pp. 29-39.
Amirfeiz et al., "Formation of silicon structures by plasma-activated wafer bonding," Journal of The Electrochemical Society, 2000, vol. 147, No. 7, pp. 2693-2698.
Amirfeiz et al., "Formation of silicon structures by plasma activated wafer bonding," vol. 99-2, Abstract No. 963, 1999 Joint Int'l Meeting of the Electrochecm. Soc'y, Dec. 16, 1999.
Arnold, Emil, "Silicon-on-insulator devices for high voltage and power IC applications," Proceedings of the Second International Symposium on Semiconductor Wafer Bonding: Science, Technology and Applications, The Electrochemical Society Proceedings, vol. 93-29 (1993), pp. 161-175.
Beitman et al., "Bonded SOI in a bipolar IC without trench isolation," Proceedings of the Second International Symposium on Semiconductor Wafer Bonding: Science, Technology and Applications, The Electrochemical Society Proceedings, vol. 93-29 (1993), pp. 144-151.
Bengtsson et al., "Low temperature bonding," International Conference on Compliant & Alternative Substrate Technology, Sep. 1999, p. 10.
Bengtsson, Stefan et al., "The Influence of Wafer Dimensions on the Contact Wave Velocity in Silicon Wafer Bonding," 69 Applied Physics Letters 3381 (1996).
Bertagnolli, E. et al., "Interchip via Technology Three-Dimensional Metallization for Vertically Integrated Circuits," Electrochemical Society Proceedings, vol. 97-36, pp. 509-520 (2000).
Bollmann et al., "Three Dimensional Metallization for Vertically Integrated Circuits," 1997 Materials for Advanced Metallization MAM '97 Abstracts Booklet 94.
Booth, D.E. et al., "Backside Imaging CCD Using Bonded and Etched Back Silicon on Epoxy," 97-36 Electrochemical Society Proceedings 584 (1998).
Booth et al., "Full three dimensional microcircuit integration techniques using wafer bonding," Proceedings of the Second International Symposium on Semiconductor Wafer Bonding: Science, Technology and Applications, The Electrochemical Society Proceedings, vol. 93-29 (1993), pp. 293-302.
Bower, R.W. et al., "Aligned Wafer Bonding: A Key to Three Dimensional Microstructures," 20 J. Electronic Materials 383, 383 (1991).
Bower, Robert W. et al., "Design Considerations of a Digital Pressure Sensor Array," 1991 International Conference on SolidState Sensors and Actuators, 1991. Digest of Technical Papers, Transducers, '91 312.
Bower, Robert W. et al., "Low Temperature S3N4 Direct Bonding," 62 Applied Physics Letters 3485 (1993).
Brugger et al., "High-precision aligned silicon wafer bonding for a micromachined AFM sensor," Proceedings of the Second International Symposium on Semiconductor Wafer Bonding: Science, Technology and Applications, The Electrochemical Society Proceedings, vol. 93-29 (1993), pp. 363-372.
Burke, Barry E. et al., Soft-X-Ray CCD Imagers for AXAF, IEEE Transactions on Electron Devices, vol. 44, No. 10, Oct. 1997, pp. 1633-1642.
Cha et al., "Design considerations for wafer bonding of dissimilar materials," Proceedings of the Second International Symposium on Semiconductor Wafer Bonding: Science, Technology and Applications, The Electrochemical Society Proceedings, vol. 93-29 (1993), pp. 257-266.
Christel et al., "Silicon fusion bonding: An important tool for the design of micromechanical silicon devices," Proceedings of the Second International Symposium on Semiconductor Wafer Bonding: Science, Technology and Applications, The Electrochemical Society Proceedings, vol. 93-29 (1993), pp. 327-339.
Chu, P. et al., "Semiconductor Applications", in Handbook of Plasma Immersion lon Implantation and Deposition, 2000, pp. 637-681.
Ciarlo, D., "High- and low-temperature bonding techniques for microstructures," Proceedings of the Second International Symposium on Semiconductor Wafer Bonding: Science, Technology and Applications, The Electrochemical Society Proceedings, vol. 93-29 (1993), pp. 313-326.
Decision—Request for Trail Granted, Inter Partes Review, U.S. Pat. No. 7,335,996, Case IPR2013-00154, dated Aug. 9, 2013, in 19 pages.
D'Agostino, Ricardo, "Plasma Etching of Si and SiO2 in SF6—O2 mixtures," 52(1) J. Appl. Phys. 162 (1981).
Desmond et al., "Low-Temperature Atmospheric Silicon-Silicon Wafer Bonding for Power Electronic Applications," 97-36 Electrochemical Society Proceedings 459 (1998).
Desmond et al., "The effects of process-induced defects on the chemical selectivity of highly-doped boron etchstops," Proceedings of the Second International Symposium on Semiconductor Wafer Bonding: Science, Technology and Applications, The Electrochemical Society Proceedings, vol. 93-29 (1993), pp. 423-432.
Duncan, T.M. et al., "Study of Fluorine in Silicate Glass With19 F Nuclear Magnetic Resonance Spectroscopy," J. Appl. Phys., Jul. 1, 1986, vol. 60, No. 1, pp. 130-136.
Eda et al., "Quartz crystal on silicon technique using direct bonding," Proceedings of the Second International Symposium on Semiconductor Wafer Bonding: Science, Technology and Applications, The Electrochemical Society Proceedings, vol. 93-29 (1993), pp. 373-381.
Eom, C. B. et al., "Fabrication of Double Sided YBa2Cu3O7 Thin Films on 2 Inch Diameter LaAlO3 Wafers by Direct Wafer Bonding," 7 IEEE Transactions on Applied Superconductivity 1244 (1997).
Esashi, "Complex micromechanical structures by low temperature bonding," Proceedings of the Second International Symposium on Semiconductor Wafer Bonding: Science, Technology and Applications, The Electrochemical Society Proceedings, vol. 93-29 (1993), pp. 348-362.
Farrens, S. N. et al., "A Kinetics Study of the Bond Strength of Direct Bonded Wafers," J. Electrochemical Society, Nov. 1994, vol. 141, No. 11, pp. 3225-3230.
Farrens et al., "Analysis of bond characteristics in Si direct-bonded materials," Proceedings of the Second International Symposium on Semiconductor Wafer Bonding: Science, Technology and Applications, The Electrochemical Society Proceedings, vol. 93-29 (1993), pp. 81-95.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Farrens et al., "Low temperature wafer bonding," Electromechanical Society Proceedings, 1997, vol. 97-36, pp. 425-436.
Feijóo et al., "BE-SOI with etch stop layers grown by RTCVD," Proceedings of the Second International Symposium on Semiconductor Wafer Bonding: Science, Technology and Applications, The Electrochemical Society Proceedings, vol. 93-29 (1993), pp. 267-279.
Feijoó, Diego et al., Silicon Wafer Bonding Studied by Infrared Absorption Spectroscopy, 65 Applied Physics Letters 2548, 2548 (1994).
Feindt et al., "A complementary bipolar process on bonded wafers," Proceedings of the Second International Symposium on Semicon-

(56) References Cited

OTHER PUBLICATIONS ductor Wafer Bonding: Science, Technology and Applications, The Electrochemical Society Proceedings, vol. 93-29 (1993), pp. 189-196.
Final Written Decision, Inter PartesReview, U.S. Pat. No. 7,335,996, Case IPR2013-00154, dated Nov. 21, 2013, in 3 pages.
First Office Action (English translation) mailed Oct. 6, 2015, issued in Japanese Patent Application No. 2012-107053, 7 pages.
Folta et al., "Low-temperature wafer bonding of surfaces using a reactive sputtered oxide," Proceedings of the Second International Symposium on Semiconductor Wafer Bonding: Science, Technology and Applications, The Electrochemical Society Proceedings, vol. 93-29 (1993), pp. 107-113.
Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.
Garofalini, Stephen H., "Atomistic structure and dynamic behavior of silica surfaces," Proceedings of the Second International Symposium on Semiconductor Wafer Bonding: Science, Technology and Applications, The Electrochemical Society Proceedings, vol. 93-29 (1993), pp. 57-70.
Gassel et al., "SIMOX and wafer bonding: Combination of competitors complements one another," Proceedings of the Second International Symposium on Semiconductor Wafer Bonding: Science, Technology and Applications, The Electrochemical Society Proceedings, vol. 93-29 (1993), pp. 433-442.
Gösele, U. et al., "Fundamental Issues in Wafer Bonding", J. Vac, Sci. Technol. A 17(4), Jul./Aug., (1999), American Vacuum Society, pp. 1145-1152.
Gösele, U. et al., "History and Future of Semiconductor Wafer Bonding," 47-48 Solid State Phenomena 33 (1996).
Gösele, U. et al., "Semiconductor Wafer Bonding", Annu. Rev. Mater. Sci. 1998, vol. 28, pp. 215-241.
Gösele et al., "Semiconductor Wafer Bonding: A flexible approach to materials combinations in microelectronics; micromechanics and optoelectronics," IEEE, 1997, pp. 23-32.
Gösele et al., "Silicon layer transfer by wafer bonding," Proceedings of the Second International |Symposium on Semiconductor Wafer Bonding: Science, Technology and Applications, The Electrochemical Society Proceedings, vol. 93-29 (1993), pp. 395-409.
Gösele, U. et al., "Wafer Bonding for Microsystems Technologies", Sensors and Actuators 74, 1999 Elsevier Science S.A, 1999, pp. 161-168.
Graf, D. et al., "Reaction of Water with Hydrofluoric Acid Treated Silicon (111) and (100) Surfaces," J. Vac. Sci. Technol., May/Jun. 1989, A7(3), pp. 808-813.
Gui et al., "The effect of surface roughness on direct wafer bonding," Journal of Applied Physics, May 15, 1999, vol. 85, No. 10, pp. 7448-7454.
Haisma, J. et al., "Silicon-on-insulator wafer bonding-wafer thinning technological evaluations," Jap. Journal—Appl. Phys., 1989, vol. 28, No. 8, pp. 1426-1443.
Harendt et al., "Bonded-wafer SOI smart power circuits in automotive applications," Proceedings of the Second International Symposium on Semiconductor Wafer Bonding: Science, Technology and Applications, The Electrochemical Society Proceedings, vol. 93-29 (1993), pp. 129-143.
Harendt, C. et al., "Vertical Polysilicon Interconnects by Aligned Wafer Bonding," Electrochemical Society Proceedings vol. 97-36, (1998), pp. 501-508.
Hayashi et al., "Fabrication of three-dimensional IC using "Cumulatively Bonded IC" (CUCIC) technology," 1990 Symp. VLSI Tech Dig., NEC Corp., Microelectronics Research Laboratories, pp. 95-96.
Henttinen, K. et al., "Mechanically Induced Si Layer Transfer in Hydrogen-Implanted Si Wafers," Applied Physics Letters, Apr. 24, 2000, vol. 76, No. 17, pp. 2370-2372.
Hobart, K.D. et al., "Fabrication of a Double-Side IGBT by Very Low Temperature Wafer Bonding," 1999 Proceedings of the 11th International Symposium on Power Semiconductor Devices and ICs 45, 46 (1999).
Horning et al., "Wafer-to-wafer bond characterization by defect decoration etching," Proceedings of the Second International Symposium on Semiconductor Wafer Bonding: Science, Technology and Applications, The Electrochemical Society Proceedings, vol. 93-29 (1993), pp. 199-206.
Huang, Qing-An et al., "Biased-Voltage Controlled Thinning for Bonded Silicon-on-Insulator Wafers," Applied Physics Letters, May 29, 1995, vol. 66, pp. 2990-2991.
Hughes, Donald L., "Silicon-silicon direct wafer bonding," Proceedings of the Second International Symposium on Semiconductor Wafer Bonding: Science, Technology and Applications, The Electrochemical Society Proceedings, vol. 93-29 (1993), pp. 17-31.
International Search Report and Written Opinion mailed Mar. 7, 2019, in International Application No. PCT/US2018/060044, 14 pages.
International Search Report and Written Opinion mailed Apr. 22, 2019 in International Application No. PCT/US2018/064982, 13 pages.
International Search Report and Written Opinion mailed Feb. 21, 2022, International Application No. PCT/US2021/072096, 12 pages.
Ismail, M.S. et al., "Digital Pressure-Switch Array with Aligned Silicon Fusion Bonding," J. Micromechanics and Microengineering, (1991), vol. 1, No. 4, pp. 231-236.
Ismail, M. S. et al., "One-Step Direct Bonding Process of Low Temperature Si3N4 and TIN Technology," 1993 Proceedings of the 7th International Conference on Solid State Sensors and Actuators, (1993), pp. 188-193.
Iyer et al., "Ultra thin silicon-on insulator using epitaxial etch stops," Proceedings of the Second International Symposium on Semiconductor Wafer Bonding: Science, Technology and Applications, The Electrochemical Society Proceedings, vol. 93-29 (1993), pp. 3-16.
Jiao et al., "Silicon direct bonding at low temperature near the boiling point of water," Proceedings of the Second International Symposium on Semiconductor Wafer Bonding: Science, Technology and Applications, The Electrochemical Society Proceedings, vol. 93-29 (1993), pp. 280-282.
Judge, John S., "A Study of the Dissolution of SiO2 in Acidic Fluoride Solutions", J. Electrochem. Soc.: Solid State Science, Nov. 1971, vol. 118, No. 11, pp. 1772-1775.
Kasi, R. et al., "Chemistry of Fluorine in the Oxidation of Silicon," Appl. Phys. Lett., Jun. 24, 1991, vol. 58, No. 25, pp. 2975-2977.
Kawai et al., "Structure of the interface of a bonded wafer," Proceedings of the Second International Symposium on Semiconductor Wafer Bonding: Science, Technology and Applications, The Electrochemical Society Proceedings, vol. 93-29 (1993), pp. 216-224.
Ker, Ming-Dou et al., "Fully process-compatible layout design on bond pad to improve wire bond reliability in CMOS ICS," IEEE Transactions on Components and Packaging Technologies, Jun. 2002, vol. 25, No. 2, pp. 309-316.
Kissinger, Gudrun et al., "Void-Free Silicon-Wafer-Bond Strengthening in the 200-400 Range," Sensors and Actuators, 1993, vol. A36, pp. 149-156.
Köhler, J. et al., "Weibull Fracture Probability for Silicon Wafer Bond Evaluation," 147 J. Electrochemical Society 4683, 4683, 4685 (2000).
Kouvatsos et al., "Silicon-Fluorine Bonding and Fluorine Profiling in SiO2 Films Grown by NF3-Enhanced Oxidation," Appl. Phys. Lett., Aug. 17, 1992, vol. 61, No. 7, pp. 780-782.
Krauter, G. et al., "Low Temperature Silicon Direct Bonding for Application in Micromechanics: Bonding Energies for Different Combinations of Oxides", Sensors and Actuators A 70, 271-275, 1998 Elsevier Science S.A.
Kub et al., "Electrical Characteristics of Low Temperature Direct Silicon-Silicon Bonding for Power Device Applications," Electrochemical Society Proceedings vol. 97-36, (1998), pp. 466-472.

(56) References Cited

OTHER PUBLICATIONS

Kuo, Y., "Deposition and etching mechanisms in plasma thin film processes," In Application of Particle and Laser Beams in Materials Technology, 1995, pp. 581-593.
Kurahashi et al., "Sensors Utilizing Si Wafer Direct Bonding at Low Temperature," 1991 Proceedings of the 2nd International Symposium on Micro Machine and Human Science 173, 173.
Li et al., "Low temperature direct bonding using pressure and temperature," SPIE, vol. 3184, 124-127 (1997).
Li, Y., "Systematic Low Temperature Bonding and its Application to the Hydrogen lon Cut Process and Three-Dimensional Structures," (1999).
Li, Y. et al., "Systematic Low Temperature Silicon Bonding Using Pressure and Temperature," 1998 Jpn. J. Appl. Phys. 37 (1998).
Ling et al., "Influence of bonding temperature on the electrical properties of Si/Si02 interfaces in bonded silicon-on-insulator-wafers" Proceedings of the Second International Symposium on Semiconductor Wafer Bonding: Science, Technology and Applications, The Electrochemical Society Proceedings, vol. 93-29 (1993), pp. 453-462.
Ljungberg et al., "Buried silicide layers in silicon using wafer bonding with cobalt as interfacial layer," Proceedings of the Second International Symposium on Semiconductor Wafer Bonding: Science, Technology and Applications, The Electrochemical Society Proceedings, vol. 93-29 (1993), pp. 249-256.
Ljungberg, Karin et al., "Improved Direct Bonding of Si and SiO2 Surfaces by Cleaning in H2SO4:H2O2:HF," Applied Physics Letters, Jul. 31, 1995vol. 67, No. 5, pp. 650-652.
Ljungberg et al., "Spontaneity of hydrophobic Si-Si bonding and properties of the bonded interfaces," Proceedings of the Second International Symposium on Semiconductor Wafer Bonding: Science, Technology and Applications, The Electrochemical Society Proceedings, vol. 93-29 (1993), pp. 473-482.
Lu, Shi-Ji et al., "A New Silicon Micromachining Method Using SOI/SDB Technology," 23 Sensors and Actuators 961 (1990).
Macary et al., "Influence of the wafer cleaning on the electrical properties of Si—Si bonded wafers," Proceedings of the Second International Symposium on Semiconductor Wafer Bonding: Science, Technology and Applications, The Electrochemical Society Proceedings, vol. 93-29 (1993), pp. 463-472.
Maszara, W.P. et al., "Bonding of Silicon Wafers for Silicon-on-Insulator", J. Appl. Phys., Nov. 15, 1988, vol. 64, No. 10, pp. 4943-4950.
Matsumoto, Satoshi et al., "Thin-Film Quasi-SOI Power MOSFET Fabricated by Reversed Silicon Wafer Direct Bonding," 45 IEEE Transactions on Electron Devices 105 (1998).
Mclachlan et al., "A bonded wafer bipolar process in manufacturing," Proceedings of the Second International Symposium on Semiconductor Wafer Bonding: Science, Technology and Applications, The Electrochemical Society Proceedings, vol. 93-29 (1993), pp. 43-54.
Mitani et al., "Investigation of the N-type inversion layer induced at the bottom of P-type active silicon layers in bonded SOI wafers," Proceedings of the Second International Symposium on Semiconductor Wafer Bonding: Science, Technology and Applications, The Electrochemical Society Proceedings, vol. 93-29 (1993), pp. 443-452.
Moriceau, H. et al., "Overview of recent direct wafer bonding advances and applications," Advances in Natural Sciences-Nanoscience and Nanotechnology, 2010, 11 pages.
Morita, M. et al., "Fluorine-Enhanced Thermal Oxidation of Silicon in the Presence of NF3," Appl. Phys. Lett., Dec. 15, 1984, vol. 45, No. 12, pp. 1312-1314.
Mumola et al., "Plasma-thinned silicon-on-insulator bonded wafers," Proceedings of the Second International Symposium on Semiconductor Wafer Bonding: Science, Technology and Applications, The Electrochemical Society Proceedings, vol. 93-29 (1993), pp. 410-422.
Nakanishi et al., "Studies on SiO2-SiO2 bonding with hydrofluoric acid—room temperature and low stress bonding technique for MEMS—" 1998 IEEE, pp. 609-614.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Nishioka, Yasushiro et al., "Dielectric Characteristics of Fluorinated Ultradry SiO2," Appl. Phys. Lett., Mar. 20, 1999, vol. 54, No. 12, pp. 1127-1129.
Nishizawa et al., "An advanced dielectric isolation structure for SOI-CMOS/BICMOS VLSIs," Proceedings of the Second International Symposium on Semiconductor Wafer Bonding: Science, Technology and Applications, The Electrochemical Society Proceedings, vol. 93-29 (1993), pp. 176-188.
Niwano et al., "Morphology of Hydrofluoric Acid and Ammonium Fluoride-Treated Silicon Surfaces lStudied by Surface Infrared Spectroscopy," J. Appl. Phys., Jun. 1, 1992, vol. 71, No. 11, pp. 5646-5649.
Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1(I), 6 pages.
Oberlin, David W., "A New Air-Isolation Process for Monolithic Integrated Circuits," 17 IEEE Transactions on Electron Devices 485 (1970).
Pankov et al., "Analysis of structural changes in plasma-deposited fluorinated silicon dioxide films caused by fluorine incorporation using ring-statistics based mechanism," Journal of Applied Physics AIP USA, Jul. 1, 1999, vol. 86, No. 1, pp. 275-280.
Plössl, A. et al., "Wafer Direct Bonding: Tailoring Adhesion Between Brittle Materials," Materials Science & Engineering, Mar. 10, 1999, vol. R25, Nos. 1-2, pp. 1-88.
Quenzer, H. J. et al., "Low Temperature Wafer Bonding for Micromechanical Applications," 1992 Micro Electro Mechanical Systems, 1992, MEMS '92 49, 52.
Rabinovich, Eliezer M. et al., "Retention of Fluorine in Silica Gels and Glass," J. Am. Ceram. Soc., 1989, vol. 72, No. 7, pp. 1229-1232.
Reiche et al., "Characterization of interfaces of directly bonded silicon wafers: A comparative study of secondary ion mass spectroscopy multiple internal reflection spectroscopy, and transmission electron microscopy," Jpn. J. Appl. Phys., vol. 35 (1996), pp. 2102-2107, Part 1, No. 4A, Apr. 1996.
Reiche et al., "The effect of a plasma pretreatment on the Si/Si bonding behaviouir," Electrochemical Society Proceedings, 1998, vol. 97-36, pp. 437-444.
Robb et al., "High temperature lateral dopant diffusion in WSi2, TiSi2 and TIN films," Proceedings ofthe Second International Symposium on Semiconductor Wafer Bonding: Science, Technology and Applications, The Electrochemical Society, Proceedings vol. 93-29 (1993), pp. 230-239.
Roberds et al., "Low temperature , in situ, plasma activated wafer bonding," Electrochecmical Society Proceedings, 1997, vol. 97-36, pp. 598-606.
Roberds et al., "Low temperature silicon direct bonding," Department of Mechanical, Aeronautical, and Materials Engineering, University of California, Davis, 1997, pp. 240-248.
Roberds, B.E. et al., "Wafer Bonding of GaAS, InP, and Si Annealed Without Hydrogen for Advanced Device Technologies," Electrochemical Society Proceedings, 1997, vol. 97-36, pp. 592-597.
Rouse et al., "Application of 150 mm bonded wafer technology to a power asic process," Proceedings of the Second International Symposium on Semiconductor Wafer Bonding: Science, Technology and Applications, The Electrochemical Society Proceedings, vol. 93-29 (1993), pp. 283-292.
Sailer et al., Creating 3D Circuits Using Transferred Films, Circuits and Devices, IEEE 1997, Nov. 1997, pp. 27-30.
Saitoh et al., "Characterization of directly bonded silicon-on-insulator structures using spectroscopic ellipsometry," Proceedings of the Second International Symposium on Semiconductor Wafer Bonding: Science, Technology and Applications, The Electrochemical Society Proceedings, vol. 93-29 (1993), pp. 207-215.
Sakakibara et al., "A wafer bonded—SOI bipolar transistor," Proceedings of the Second International Symposium on Semiconductor

(56) References Cited

OTHER PUBLICATIONS

Wafer Bonding: Science, Technology and Applications, The Electrochemical Society Proceedings, vol. 93-29 (1993), pp. 152-160.
*Samsung Electronics Co., LTD. and Samsung Electronics America, Inc.* v. *Invensas Bonding Technologies, Inc.*, Petition for Inter Partes Review of U.S. Pat. No. 9,431,368, dated Oct. 1, 2018, pp. 1-84, (IPR2019-00007_368_IPR_Petition).
*Samsung Electronics Co., LTD. and Samsung Electronics America, Inc.* v. *Invensas Bonding Technologies, Inc.*, Petition for Inter Partes Review of U.S. Pat. No. 9,391,143, dated Oct. 2, 2018, pp. 1-65, (IPR2019-00020_143_I_IPR_Petition)(Part 1).
*Samsung Electronics Co., LTD. and Samsung Electronics America, Inc.* v. *Invensas Bonding Technologies, Inc.*, Petition for Inter Partes Review of U.S. Pat. No. 9,391,143, dated Oct. 2, 2018, pp. 1-83, (IPR2019-00021_143_II_IPR_Petition)(Part 2).
*Samsung Electronics Co., LTD. and Samsung Electronics America, Inc.* v. *Invensas Bonding Technologies, Inc.*, Petition for Inter Partes Review of U.S. Pat. No. 7,553,744, dated Oct. 1, 2018, pp. 1-74, (Petition-7553744-IPR2019-00001).
*Samsung Electronics Co., LTD. and Samsung Electronics America, Inc.* v. *Invensas Bonding Technologies, Inc.*, Petition for Inter Partes Review of U.S. Pat. No. 7,807,549, dated Oct. 1, 2018, pp. 1-69, (Petition-7807549-IPR2019-00004).
*Samsung Electronics Co., LTD. and Samsung Electronics America, Inc.* v. *Invensas Bonding Technologies, Inc.*, Petition for Inter Partes Review of U.S. Pat. No. 7,807,549, dated Oct. 1, 2018, pp. 1-48, (Petition-7807549-IPR2019-00005).
*Samsung Electronics Co., LTD. and Samsung Electronics America, Inc.* v. *Invensas Bonding Technologies, Inc.*, Petition for Inter Partes Review of U.S. Pat. No. 7,871,898, dated Oct. 1, 2018, pp. 1-82, (Petition-7871898-IPR2019-00006).
*Samsung Electronics Co., LTD. and Samsung Electronics America, Inc.* v. *Invensas Bonding Technologies, Inc.*, Petition for Inter Partes Review of U.S. Pat. No. 8,153,505, dated Oct. 2, 2018, pp. 1-59, (Petition-8153505-IPR2019-00022).
*Samsung Electronics Co., LTD. and Samsung Electronics America, Inc.* v. *Invensas Bonding Technologies, Inc.*, Petition for Inter Partes Review of U.S. Pat. No. 8,153,505, dated Oct. 2, 2018, pp. 1-67, (Petition-8153505-IPR2019-00023).
Schmidt, Martin A., "Wafer-To-Wafer Bonding for Microstructure Formation," 86 Proceedings of the IEEE 1575, 1578 (1998).
Schumacher, Andreas et al., "The Bonding Energies of Oxidized Silicon Wafers for Micromechanical Applications at Moderate Temperatures," Electrochemical Society Proceedings vol. 97-36, (1998), pp. 155-162.
Shajii et al., "A backside contact technology for a wafer-bonded liquid shear-stress sensor," Proceedings of the Second International Symposium on Semiconductor Wafer Bonding: Science, Technology and Applications, The Electrochemical Society Proceedings, vol. 93-29 (1993), pp. 340-347.
Shimbo, M. et al., "Silicon-to-Silicon Direct Bonding Method," J. Appl. Phys., Oct. 15, 1986, vol. 60, No. 8, pp. 2987-2989.
Söderbärg et al., "Formation of heat sinks using bonding and etch back technique in combination with diamond deposition," Proceedings of the Second International Symposium on Semiconductor Wafer Bonding: Science, Technology and Applications, The Electrochemical Society Proceedings, vol. 93-29 (1993), pp. 382-391.
Sooriakumar et al., "Thermal mismatch strain in anodically bonded silicon and glass," Proceedings of the Second International Symposium on Semiconductor Wafer Bonding: Science, Technology and Applications, The Electrochemical Society Proceedings, vol. 93-29 (1993), pp. 225-229.
Stanley, Timothy, "Revenue sensitivity to yield and starting wafer cost in Soi Sram production," Proceedings of the Second International Symposium on Semiconductor Wafer Bonding: Science, Technology and Applications, The Electrochemical Society Proceedings, vol. 93-29 (1993), pp. 303-309.
Stengl, R. et al., "A Model for the Silicon Wafer Bonding Process", Jpn. J. Appl. Phys., Oct. 1989, vol. 28, No. 10, pp. 1735-1741.
Steinkirchner, Johann et al., "Silicon Wafer Bonding via Designed Monolayers," 7 Advanced Materials 7, 662 (1995).
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Sun et al., "Cool plasma activated surface in silicon wafer direct bonding technology," Journal De Physique, Sep. 1988, pp. C4-79-C4-82.
Sunada, Takeshi et al., "The Role of Fluorine Termination in the Chemical Stability of HF-Treated Si Surfaces," Jpn, J. Appl. Phys., Dec. 1990, vol. 29, No. 12, pp. L2408-L2410.
Takagi et al., "Effect of surface roughness on room-temperature wafer bonding by Ar beam surface activation," Jpn. J. Appl. Phys., vol. 37, No. 7, Jul. 1998, pp. 4197-4203.
Takagi et al., "Low temperature direct bonding of silicon and silicon dioxide by the surface activation method," Transducers 1997, 1997 Int. Conf. on Solid State Sensors and Actuators, Jun. 16-19, 1997, pp. 657-660.
Takagi, Hideki et al., "Room-Temperature Bonding of Lithium Niobate and Silicon Wafers by Argon-Beam Surface Activation," Appl. Phys. Lett., Apr. 19, 1999, vol. 74, No. 16, pp. 2387-2389.
Takagi, H. et al., "Surface Activated Bonding of Silicon Wafers at Room Temperature," Appl. Phys. Lett., Apr. 15, 1996, vol. 68, No. 16, pp. 2222-2224.
Takagi, H. et al., "Transmission Electron Microscope observations of Si/Si Interface Bonded at Room Temperature by Ar Beam Surface Activation", Jpn. J. Appl. Phys., Mar. 1999, vol. 28, Part 1, No. 3A, pp. 1589-1594.
Takagi, Hideki et al., "Low-Temperature Direct Bonding of Silicon and Silicon Dioxide by the Surface Activation Method", Sensors and Actuators A, Oct. 1, 1998, vol. 70, No. 1-2, pp. 164-170.
Tong, Q.-Y. et al., "A Model of Low-Temperature Wafer Bonding and its Applications," J. Electrochem. Soc., May 1996, vol. 143, No. 5, pp. 1773-1779.
Tong et al., "A "smarter-cut" approach to low temperature silicon layer transfer," Appl. Phys. Lett. Jan. 5, 1998, vol. 72, No. 1, pp. 49-51.
Tong, Q.-Y. et al., "Diffusion and Oxide Viscous Flow Mechanism in SDB Process and Silicon Wafer Rapid Thermal Bonding," Electronic Letters, May 1990, vol. 26, Issue 11, pp. 697-699.
Tong et al., "Fabrication of Ultrathin SOI by SIMOX Wafer Bonding (SWB)," Journal of Electronic Materials, vol. 22, No. 7, 1993, 763-768.
Tong, Q.-Y. et al., "Feasibility Study of VLSI Device Layer Transfer by CMP PETEOS Direct Bonding," Proceedings 1996 IEEE International SOI Conference, Oct. 1996, pp. 36 and 37.
Tong et al., "Hydrophobic silicon wafer bonding," Appl. Phys. Lett., Jan. 31, 1994, vol. 64, No. 5, pp. 625-627.
Tong, Q.-Y. et al., "Layer Splitting Process in Hydrogen-Implanted Si, Ge, SiC, and Diamond Substrates," Appl. Phys. Lett., Mar. 17, 1997, vol. 70, No. 11, pp. 1390-1392.
Tong et al., "Low temperature InP layer transfer," Electronics Letters, Feb. 18, 1999, vol. 35, No. 4, pp. 341-342.
Tong, Q.-Y. et al., "Low Temperature Si Layer Splitting," 1997 Proceedings 1997 IEEE International SOI Conference 126.
Tong et al., "Low temperature wafer direct bonding," Journal of Microelectomechanical Systems, Mar. 1994, vol. 3, No. 1, pp. 29-35.
Tong et al., "Low temperature wafer direct bonding," Proceedings of the Second International Symposium on Semiconductor Wafer Bonding: Science, Technology and Applications, The Electrochemical Society Proceedings, vol. 93-29 (1993), pp. 96-106.
Tong, Q.-Y. et al., "Low Vacuum Wafer Bonding," Electrochemical and Solid-State Letters, 1998, vol. 1, No. 1, pp. 52-53.
Tong et al., "Materials with a buried C60 layer produced by direct wafer bonding," J. Electrochem Soc., vol. 141, No. 10, Oct. 1994, pp. 137-138.
Tong, Q.-Y. et al., "Semiconductor Wafer Bonding: Recent Developments", Materials Chemistry and Physics, 1994, vol. 37, pp. 101-127.
Tong, Q.-Y. et al., Semiconductor Wafer Bonding Science and Technology, John Wiley & Sons, Inc., New York, 1999.

(56) References Cited

OTHER PUBLICATIONS

Tong, Q.-Y. et al., "Silicon Carbide Wafer Bonding," J. Electrochemical Society, Jan. 1995, vol. 142, No. 1, pp. 232-236.
Tong, Q.-Y. et al., "Thickness Considerations in Direct Silicon Wafer Bonding," J. Electrochemical Society, 142.11, (1995), pp. 3975-3979.
Tong, Q.-Y. et al., "Transfer of Semiconductor and Oxide Films by Wafer Bonding and Layer Cutting," J. Electronic Materials, (2000), vol. 29, No. 7, pp. 928-933.
Tong et al., "Ultrathin single-crystalline silicon on quartz (SOQ) by 150 C wafer bonding," Sensors and Actuators A 48 (1995) 117-123.
Tong et al., "Wafer bonding and layer splitting for microsystems**," Advanced Materials, 1999, vol. 11, No. 17, pp. 1409-1425.
Tong, Q.-Y. et al., "Wafer Bonding of Si With Dissimilar Materials," pp. 524-526 (1995).
Vossen, John L. et al., Thin Film Processes, Academic Press (1978) (excerpts).
Vossen, John L. et al., Thin Film Processes II, Academic Press (1991) (excerpts).
Watt, V.H.C. et al., "Low Temperature Direct Bonding on Nonhydrophilic Surfaces," 30 Electronic Letters 693, 694 (1994).
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Williams et al., "Mobile Fluoride Ions in SiO2", Journal of Applied Physics, Feb. 1975, vol. 46, No. 2, pp. 695-698.
Wright, Peter J. et al., "The Effect of Fluorine in Silicon Dioxide Gate Dielectrics," IEEE Transactions on Electron Devices, May 1989, vol. 36, No. 5, pp. 879-889.
Xu et al., "Novel Two-Step SDB Technology for High-Performance Thin-Film SOI/MOSFET Applications," Electronics Letters, Mar. 16, 1989, vol. 25, No. 6 pp. 394-395.
Xu et al., "Silicon on Quartz by Solid-State Diffusion Bonding (SSDB) Technology," Electronics Letters, May 26, 1988, vol. 24, No. 11 pp. 691-692.
Yallup, Kevin, "Analog CMOS circuits on thick film SOI," Proceedings of the Second International Symposium on Semiconductor Wafer Bonding: Science, Technology and Applications, The Electrochemical Society Proceedings, vol. 93-29 (1993), pp. 117-128.
Yokoi, Hideki et al., "Analysis of GalnASP Surfaces by Contact-Angle Measurement for Wafer Direct Bonding with Garnet Crystals," 38 Japanese J. Applied Physics 4780 (1999).
Yoshimaru, M. et al., "Interaction Between Water and Fluorine-Doped Silicon Oxide Films Deposited by Plasma-Enhanced Chemical Vapor Deposition," J. Vac. Sci. Technol. A, Nov./Dec. 1997, vol. 15, No. 6, pp. 2915-2922.
*Ziptronix, Inc.* v. *Omnivision Technologies*, Complaint for Patent Infringement, Case 4:10-cv-05525-SBA, Document 48, filed May 4, 2011, pp. 1-29.
*Ziptronix, Inc.* v. *Ominvision Technologies*, Defendant TSMC's Answer and Affirmative Defenses to Ziptronix First Amended Complaint, Case No. 4:10-cv-05525-SBA, Document 49, filed May 4, 2011, pp. 1-45.
*Ziptronix, Inc.* v. *Omnivision Technologies*, Complaint for Patent Infringement, Case No. 4:10-cv-05525-SBA Document 1, filed Dec. 16, 2010, pp. 1-17.
*Ziptronix, Inc.* v. *Omnvision Technologies, Inc.*, Defendants' Third Supplemental Consolidated Invalidity Contentions Under Patent Local Rule 3-3, Case No. 4:10-cv-05525-SBA, filed Jun. 14, 2013, pp. 1-5379, (submitted in multiple parts).
Zucker et al., "Application of oxygen plasma processing to silicon direct bonding," Sensors and Actuators A, 36 (1993), pp. 227-231.
Bush, Steve, "Electronica: Automotive power modules from on Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, Electronics Weekly.com ("BUSH article"); however, the imaged part and the part shown in the BUSH article share the part number "Onsemi AR0820."
Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."
SAMCO Inc., "Plasma Cleaning of Metals (Copper & Silver) Without Surface Oxidationi". Downloaded on Aug. 11, 2023 online: https://www.samcointl.com/featured-solutions/plasma-cleaning-metal-copper-silver/; 13 pages.

* cited by examiner

1000

1002 Provide a first element having a polymeric material and a dielectric bonding layer

↓

1004 Expose the dielectric bonding layer to water vapor plasma

↓

1006 Directly bond a second element to the dielectric bonding layer of the first element

DIRECT BONDING METHODS AND STRUCTURES

BACKGROUND

Field

The field relates to direct bonding methods and structures.

Description of the Related Art

Microelectronic elements, such as integrated device dies or chips, may be mounted or stacked on other elements thereby forming a bonded structure. Direct metal bonding can be conducted at low temperatures and without external pressure. For example, direct hybrid bonding involves directly bonding non-conductive features (e.g., inorganic dielectrics) of different elements together, without intervening adhesives, while also directly bonding conductive features (e.g., metal pads or lines) of the elements together. For example, a microelectronic element can be mounted to a carrier, such as a wafer, an interposer, a reconstituted wafer or other element, etc. As another example, a microelectronic element can be stacked on top of another microelectronic element, e.g., a first integrated device die can be stacked on a second integrated device die. Each of the microelectronic elements can have conductive pads for mechanically and electrically bonding the elements to one another. There is a continuing need for improved methods for forming the bonded structure.

DETAILED DESCRIPTION OF THE PREFERRED EMBODIMENT

Figure 1A:
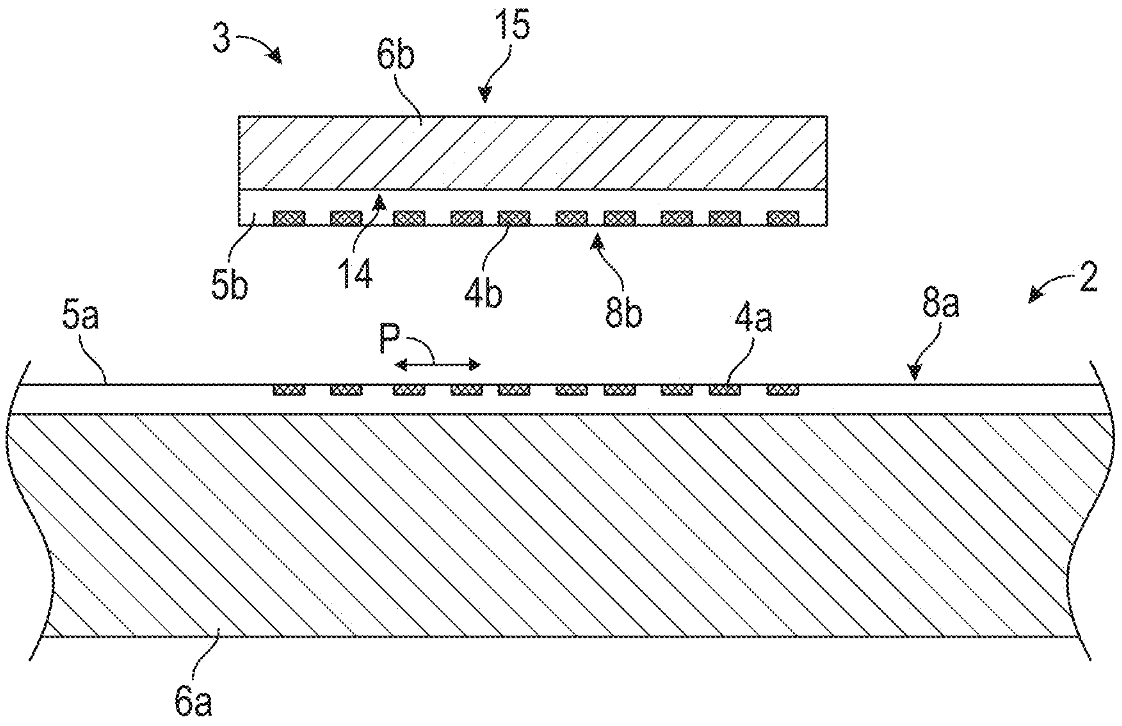
FIGS. 1A and 1B are schematic side sectional views showing stages of direct bonding according to some embodiments.
Figure 1B:
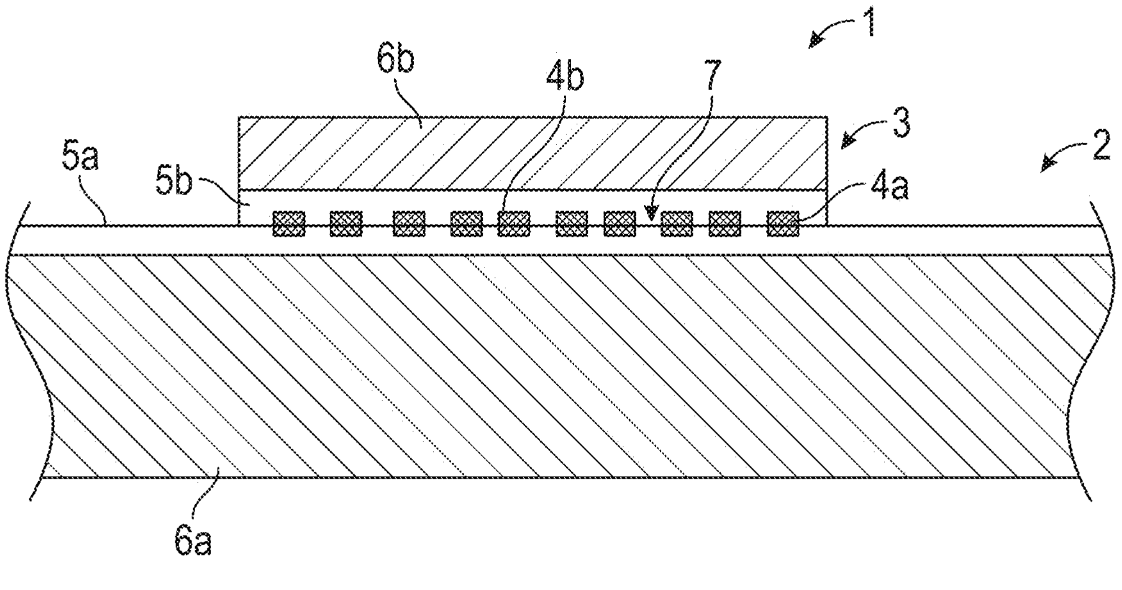

With reference initially to FIGS. 1A and 1B, various embodiments disclosed herein relate to directly bonded structures 1 in which two elements 2, 3 can be directly bonded to one another without an intervening adhesive. While the illustrated embodiment involves direct hybrid bonding of conductive and non-conductive elements, the skilled artisan will appreciate that the advantages and principles taught herein also apply to direct bonding of non-conductive surfaces.

A bonded structure comprises two elements that can be directly bonded to one another without an intervening adhesive. Two or more elements (such as integrated device dies, wafers, passive devices, individual active devices such as power switches, glass substrates, flat panels other microelectronic elements, etc.) 2, 3 may be stacked on or bonded to one another to form a bonded structure 1. Conductive features (e.g., contact pads 4*a*, traces, exposed ends of vias, or through substrate electrodes or vias) of a first element 2 may be electrically connected to corresponding conductive features (e.g., contact pads 4*b*) of a second element 3. Any suitable number of elements can be stacked in the bonded structure 1. For example, a third element (not shown) can be stacked on the second element 3, a fourth element (not shown) can be stacked on the third element, etc. Additionally or alternatively, one or more additional elements (not shown) can be stacked laterally adjacent one another along the first element 2. In some embodiments, the laterally stacked additional element may be smaller than the second element. In some embodiments, the laterally stacked additional element may be at least two times smaller than the second element.

In some embodiments, the elements 2, 3 are directly bonded to one another without an adhesive. In various embodiments, a non-conductive field region that includes a non-conductive or dielectric material can serve as a first bonding layer 5*a* of the first element 2 which can be directly bonded to a corresponding non-conductive field region that includes a non-conductive or dielectric material serving as a second bonding layer 5*b* of the second element 3 without an adhesive. The non-conductive bonding layers 5*a*, 5*b* can be disposed on respective front sides 14 of device portions 6*a*, 6*b*, such as a semiconductor (e.g., silicon) portion of the elements 2, 3, or back-end-of-line (BEOL) interconnect layers over such semiconductor portions. Active devices and/or circuitry can be patterned and/or otherwise disposed in or on the device portions 6*a*, 6*b*. Active devices and/or circuitry can be disposed at or near the front sides of the device portions 6*a*, 6*b*, and/or at or near opposite backsides of the device portions 6*a*, 6*b*. The non-conductive material can be referred to as a non-conductive bonding region or bonding layer 5*a* of the first element 2. In some embodiments, the non-conductive bonding layer 5*a* of the first element 2 can be directly bonded to the corresponding non-conductive bonding layer 5*b* of the second element 3 using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 5*a* and/or 5*b* can comprise a non-conductive material such as a dielectric material, such as silicon oxide, or an undoped semiconductor material, such as undoped silicon. Suitable dielectric bonding surface or materials for direct bonding include but are not limited to inorganic dielectric materials including silicon, such as silicon oxide, silicon nitride, fluorinated oxides, fluorinated silicon glass (FSG), or silicon oxynitride, or can include carbon, such as silicon carbide, silicon oxycarbonitride, low K dielectric materials, SiCOH dielectrics, silicon carbonitride, or a diamond-like carbon or a material comprising of a diamond surface. Such carbon-containing ceramic materials can be considered inorganic, despite the inclusion of carbon. In some embodiments, the dielectric materials may not comprise polymer materials, such as epoxy, resin, or molding materials.

In various embodiments, direct hybrid bonds can be formed without an intervening adhesive. For example, non-conductive bonding surfaces 8*a*, 8*b* can be polished to a high degree of smoothness. The non-conductive bonding surfaces 8*a* and 8*b* can be polished using, for example, chemical mechanical polishing (CMP). The roughness of the polished bonding surfaces 8*a* and 8*b* can be less than 30 Å rms. For example, the roughness of the bonding surfaces 8*a* and 8*b* can be in a range of about 0.1 Å rms to 15 Å rms, 0.5 Å rms to 10 Å rms, or 1 Å rms to 5 Å rms. The bonding surfaces 8*a*, 8*b* can be cleaned and exposed to a plasma and/or etchants to activate the surfaces 8*a*, 8*b*. In some embodiments, the surfaces 8*a*, 8*b* can be terminated with a species after activation or during activation (e.g., during the plasma and/or etch processes). Without being limited by theory, in some embodiments, the activation process can be performed to break chemical bonds at the bonding surfaces 8*a*, 8*b*, and the termination process can provide additional chemical species at the bonding surfaces 8*a*, 8*b* that improves the bonding energy during direct bonding. In some embodiments, the activation and termination are provided in the same step, e.g., a plasma to activate and terminate the surfaces 8*a*, 8*b*. In other embodiments, the bonding surface 8*a*, 8*b* can be terminated in a separate treatment to provide the additional species for direct bonding. In various embodiments, the terminating species can comprise nitrogen. For example, in some embodiments, the terminating species can comprise a nitrogen-bearing fluid or liquid. In some embodiments, the bonding surfaces 8*a*, 8*b* can be exposed to a nitrogen-containing plasma. Further, in some embodiments, the bonding surfaces 8*a*, 8*b* can be exposed to fluorine. For example, there may be one or multiple fluorine peaks at or near bonding interface 7 between the first and second elements 2, 3. Thus, in the directly bonded structure 1, the bonding interface 7 between two non-conductive materials (e.g., the bonding layers 5*a*, 5*b*) can comprise a very smooth interface with higher nitrogen content and/or fluorine peaks at the bonding interface 7. Additional examples of activation and/or termination treatments may be found throughout U.S. Pat. Nos. 9,564,414; 9,391,143; and 10,434,749, the entire contents of each of which are incorporated by reference herein in their entirety and for all purposes. In some embodiments described hereinbelow, a water plasma activation process can leave hydroxyl groups on the planarized surface that is ready for direct bonding, with very low or no nitrogen content at the bonding surface. Furthermore, in some process variants, nitrogen may also be included in the water plasma activation embodiments described below, which may allow stronger bond energy at room temperature, before any anneal.

In various embodiments, conductive features (e.g., conductive contact pads 4*a*) of the first element 2 can also be directly bonded to corresponding conductive features (e.g., conductive contact pads 4*b*) of the second element 3. For example, a hybrid bonding technique can be used to provide conductor-to-conductor direct bonds along the bond interface 7 that includes covalently direct bonded non-conductive-to-non-conductive (e.g., dielectric-to-dielectric) surfaces, prepared as described above. In various embodiments, the conductor-to-conductor (e.g., contact pad 4*a* to contact pad 4*b*) direct bonds and the dielectric-to-dielectric hybrid bonds can be formed using the direct hybrid bonding techniques disclosed at least in U.S. Pat. Nos. 9,716,033 and 9,852,988, the entire contents of each of which are incorporated by reference herein in their entirety and for all purposes. In direct hybrid bonding embodiments described herein, conductive features are provided within non-conductive bonding layers, and both conductive and non-conductive features are prepared for direct bonding, such as by the planarization, activation and/or termination treatments described above. Thus, the bonding surface prepared for direct hybrid bonding includes both conductive and non-conductive features.

For example, non-conductive (e.g., dielectric) bonding surfaces 8*a*, 8*b* (for example, inorganic dielectric surfaces) can be prepared and directly bonded to one another without an intervening adhesive as explained above. Conductive features (e.g., conductive contact pads 4*a*, 4*b*, which may be at least partially surrounded by non-conductive dielectric field regions within the bonding layers 5*a*, 5*b*) may also directly bond to one another without an intervening adhesive. In various embodiments, the conductive features can comprise discrete pads at least partially embedded in the non-conductive field regions. In some embodiments, the conductive contact features can comprise exposed contact surfaces of traces or through substrate vias (TSVs). In some embodiments, the respective conductive features (e.g., contact pads 4*a*, 4*b*) can be recessed below exterior (e.g., upper) surfaces 8*a*, 8*b* (e.g., non-conductive bonding surfaces) of the dielectric field region or non-conductive bonding layers 5*a*, 5*b*, for example, recessed by less than 30 nm, less than 20 nm, less than 15 nm, or less than 10 nm, for example, recessed in a range of 2 nm to 20 nm, or in a range of 4 nm to 10 nm. However, embodiments of the elements 2, 3 are not limited to those where the conductive features (e.g., contact pads 4*a*, 4*b*) are recessed by 30 nm or less. For example, in embodiments where the conductive features have a thickness greater than 5 μm, the conductive features can be recessed by more than 30 nm due to greater vertical expansion of the metal. In various embodiments, prior to direct bonding, the recesses in the opposing elements can be sized such that the total gap between opposing contact pads is less than 30 nm, less than 20 nm, less than 15 nm, or less than 10 nm. For example, in practice, the smaller the total recess, the lower the annealing or bonding temperature. For example, in embodiments where the conductive features have a width of 5-10 μm, the conductive features can be annealed at a temperature below 250° C. The non-conductive bonding layers 5*a*, 5*b* can be directly bonded to one another without an adhesive at room temperature in some embodiments and, subsequently, the bonded structure 1 can be annealed. Upon annealing, the conductive features (e.g., contact pads 4*a*, 4*b*) can expand and contact one another to form a metal-to-metal direct bond. Beneficially, the use of Direct Bond Interconnect, or DBI®, techniques commercially available from Adeia of San Jose, CA, can enable high density of conductive features (e.g., pads 4*a*, 4*b*) to be connected across the direct bond interface 7 (e.g., small or fine pitches for regular arrays). In some embodiments, the pitch p of the conductive features (e.g., bonding pads 4*a*, 4*b* or conductive traces embedded in the bonding surface of one of the bonded elements) may be less than 100 microns or less than 10 microns or even less than 2 microns. For some applications, the ratio of the pitch of the conductive features (e.g., bonding pads 4*a*, 4*b*) to one of the dimensions (e.g., a diameter) of the bonding pad is less than 20, or less than 10, or less than 5, or less than 3 and sometimes desirably less than 2. In other applications the width of the conductive traces embedded in the bonding surface of one of the bonded elements may range between 0.3 microns to 20 microns, e.g., in a range of 0.3 microns to 3 microns. In various embodiments, the conductive features (e.g., contact pads 4*a*, 4*b* and/or traces) can comprise copper, although other metals may be suitable.

Thus, in direct bonding processes, a first element 2 can be directly bonded to a second element 3 without an intervening adhesive. In some arrangements, the first element 2 can comprise a singulated element, such as a singulated integrated device die. In other arrangements, as shown in FIGS. 1A-1B, the first element 2 can comprise a carrier or substrate (e.g., a wafer) that includes a plurality (e.g., tens, hundreds, or more) of device regions that, when singulated, form a plurality of integrated device dies. Similarly, the second element 3 can comprise a singulated element, such as a singulated integrated device die, as shown in FIGS. 1A-1B. In other arrangements, the second element 3 can comprise a carrier or substrate (e.g., a wafer, a flat panel, or a package). The embodiments disclosed herein can accordingly apply to wafer-to-wafer (W2 W), die-to-die (D2D), or die-to-wafer (D2 W) bonding processes. In W2 W processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the singulation process for the bonded structure (e.g., saw markings if a saw singulation process is used).

As explained herein, the first and second elements 2, 3 can be directly bonded to one another without an adhesive, which is different from a deposition process. In one application, a width of the first element 2 in the bonded structure is similar to a width of the second element 3. In some other embodiments, a width of the first element 2 in the bonded structure 1 is different from a width of the second element 3. Similarly, the width or area of the larger element in the bonded structure may be at least 10% larger than the width or area of the smaller element. The first and second elements 2, 3 can accordingly comprise non-deposited elements. Further, directly bonded structures 1, unlike deposited layers, can include a defect region along the bond interface 7 in which nanometer-scale voids (nanovoids) are present. The nanovoids may be formed due to activation of the bonding surfaces 8*a*, 8*b* (e.g., exposure to a plasma). As explained above, the bond interface 7 can include concentration of materials from the activation and/or last chemical treatment processes. For example, in embodiments that utilize a nitrogen plasma for activation, a nitrogen peak can be formed at the bond interface 7. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace some of the OH groups of a hydrolized (OH-terminated) surface with N—H moieties or species, yielding a nitrogen-terminated surface. In embodiments that utilize an oxygen plasma and/or water plasma for activation, an oxygen peak can be formed at the bond interface 7. In some embodiments, the bond interface 7 can comprise silicon oxynitride, silicon oxycarbonitride, or silicon carbonitride. As explained herein, the direct bond can comprise a covalent bond, which is stronger than van Der Waals bonds. The bonding layers 5*a*, 5*b* can also comprise polished surfaces that are planarized to a high degree of smoothness.

In various embodiments, the metal-to-metal bonds between the contact pads 4*a*, 4*b* can be joined such that copper grains grow into each other across the bond interface 7. In some embodiments, the copper grains grow into each other across the bond interface after annealing the bonded structures or substrates, e.g., at temperatures between 50° C. and 400° C. or at temperatures between 80° C. and 300° C. In some embodiments, the copper can have grains oriented along the 111 crystal plane for improved copper diffusion across the bond interface 7. In some embodiments, the conductive features 4*a*, 4*b* may have a nanotwinned copper grain structure or may be a fine grain copper having an average grain size (as measured from either the top view or a cross-sectional view) of less than 0.5 μm or even less than 0.3 μm. The bond interface 7 can extend substantially entirely to at least a portion of the bonded conductive features (e.g., bonded contact pads 4*a*, 4*b*), such that there is substantially no gap between the non-conductive bonding layers 5*a*, 5*b* at or near the bonded conductive features. In some embodiments, a barrier layer may be provided under the conductive features (e.g., which may include copper). In other embodiments, however, there may be no barrier layer under the conductive features, for example, as described in U.S. Pat. No. 11,195,748, which is incorporated by reference herein in its entirety and for all purposes.

Beneficially, the use of the hybrid bonding techniques described herein can enable extremely fine pitch between adjacent contact pads 4*a* or 4*b*, and/or small pad sizes. For example, in various embodiments, the pitch p (see FIG. 1A), i.e., the distance from edge-to-edge or center-to-center between adjacent conductive features (e.g., between adjacent contact pads 4*a* or adjacent contact pads 4*b*) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

As described above, the non-conductive bonding layers 8*a*, 8*b* can be directly bonded to one another without an adhesive and, subsequently, the bonded structure 1 can be annealed. Upon annealing, the conductive features 4*a*, 4*b* can expand and contact one another to form a metal-to-metal direct bond. In some embodiments, the materials of the conductive features 4*a*, 4*b* can interdiffuse during the annealing process.

In various embodiments, the second element 3 can comprise a singulated device die, and the first element 2 can comprise a wafer. In other embodiments, both elements 2, 3 can comprise a singulated device die. In such an embodiment, the second element 3 may be initially provided in wafer form or larger substrate and singulated to form the singulated first element 3. However, the singulation process and/or other processing steps may produce debris that can contaminate the planar bonding surface, which can leave voids and/or defects when two elements are bonded. Accordingly, prior to singulation, a protective layer can be provided over the bonding surface before singulation to prevent debris from contaminating the bonding surface. The protective layer can comprise an organic or inorganic layer (e.g., a photoresist) that is deposited (e.g., spin coated onto)

the bonding surface. Additional details of the protective layer may be found throughout U.S. Pat. No. 10,714,449, the entire contents of which are incorporated by reference herein in their entirety and for all purposes. The wafer containing the first element can be singulated using any suitable method. The protective layer over the bonding surface can beneficially protect the bonding surface from debris. Before direct bonding, the protective layer can be removed from the bonding surface with a cleaning agent, for example with a suitable solvent, such as an alkaline solution or other suitable cleaning agent as recommended by the supplier of the protective layer. The protective layer cleaning agent can be selected such that it does not substantially roughen the smooth bonding surface of the bonding layer and does not substantially etch or contaminate the metal of the contact pad to increase the recess of the pad metal after subsequent cleaning operations. An excessive pad recess may form a recess that is too deep, which may prevent (or reduce the strength of) pad-to-pad bonding at the appropriate annealing conditions (e.g., annealing temperature and times). The cleaning agent can be applied by a fan spray of the liquid cleaning agent or other known methods. For example, the cleaned bonding surface can be ashed (e.g., using an oxygen plasma) and cleaned with deionized (DI) water. In some embodiments, the cleaned element can be activated before direct bonding. In some embodiments, cleaning and activation can be conducted with the same plasma treatment, such as the water plasma embodiments described hereinbelow.

In some direct bonding systems, the bonding surfaces of the semiconductor elements are terminated by exposing them to nitrogen plasma. The nitrogen plasma interacts with the atoms at the bonding surfaces and provides additional chemical species at the bonding surfaces that improve the bonding energy during direct bonding. However, oxygen plasma tends to interact with the surface of the conductive features, forming metal oxides. For example, where the conductive features comprise aluminum, nickel, or copper conductive features, the oxygen plasma can interact with the surfaces of the conductive features and form aluminum oxide, nickel oxide, or copper oxide, respectively. The presence of aluminum oxide and nickel oxide at the bonding surface of the conductive feature tend to suppress bonding or produce unreliable metallurgical bonding between the opposing conductive pads. Accordingly, these metal oxides are typically removed using various cleaning agents. These cleaning agents can etch the surface of the of the conductive features, which can result in an excessive pad recess and create difficulties in controlling consistent conductor bonding across the substrates. Accordingly, there is a need for a direct bonding process that allows for the activation of bonding surfaces while permitting reliable connections between conductive features in direct hybrid bonding.

Figure 2:
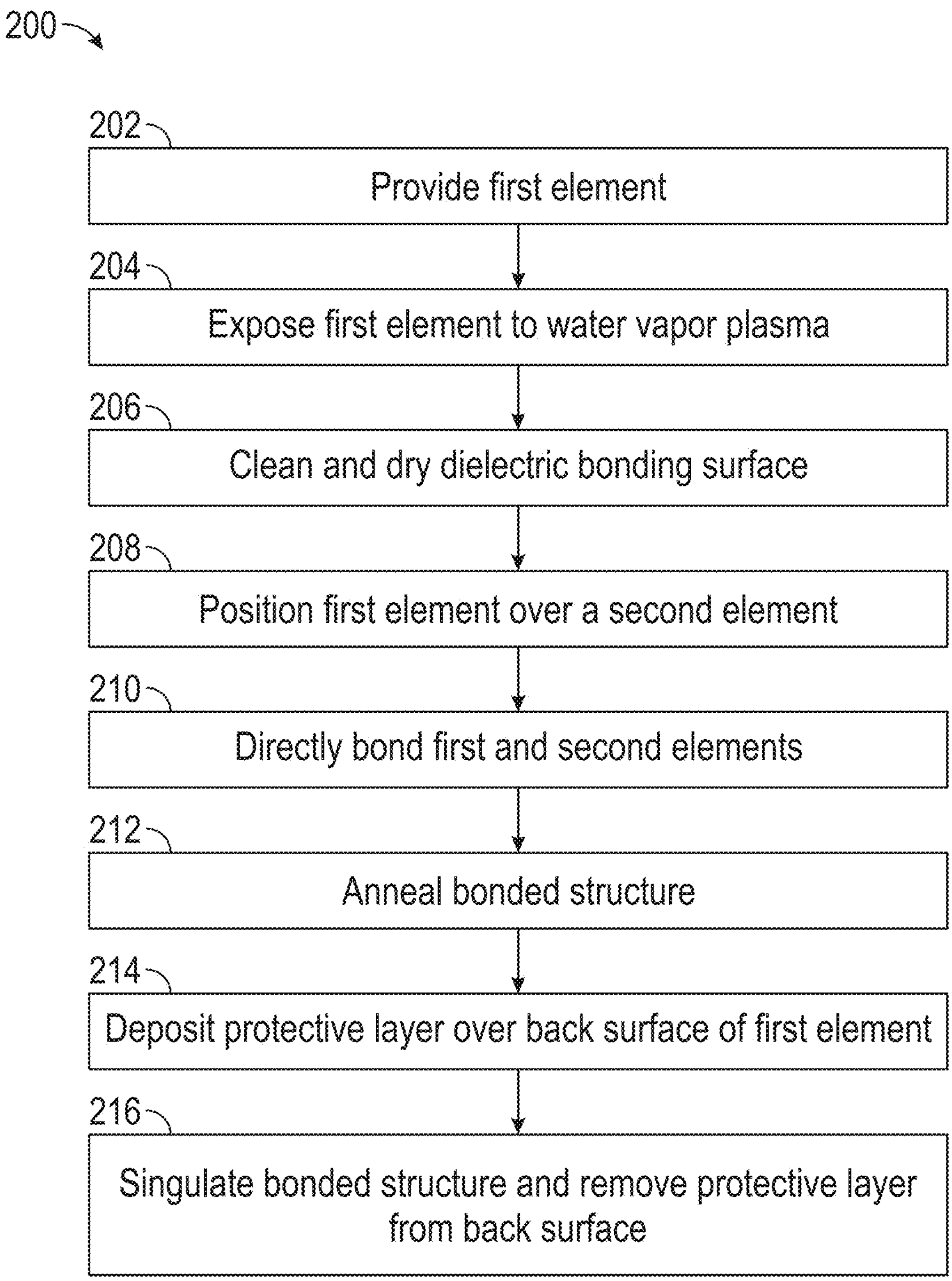
FIG. 2 is a flowchart illustrating a bonding process that involves exposing an element to water vapor plasma, according to some embodiments.
Figure 3A:
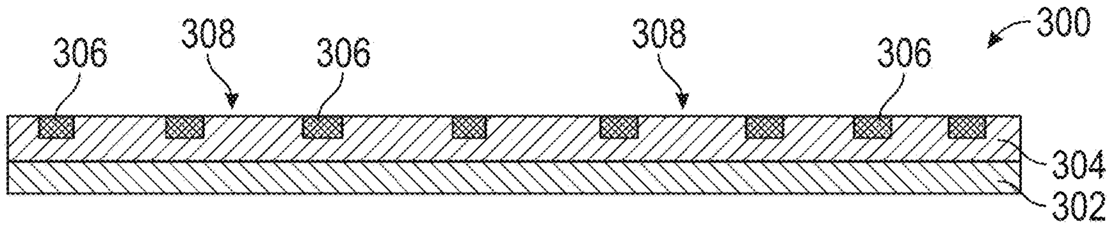
FIGS. 3A-3J are schematic side sectional views of elements at various blocks of a wafer-to-wafer bonding process, according to some embodiments.

FIG. 2 is a flowchart illustrating a bonding process 200 that includes exposing the bonding surface(s) to water vapor plasma. FIGS. 3A-3J are schematic side sectional views of elements such as semiconductor elements 300, 330 at various blocks of a W2 W example of the process 200 shown in FIG. 2. As shown in FIG. 3A, at block 202, an element to be bonded, such as a semiconductor element 300, is provided. The semiconductor element 300 includes a substrate 302, a dielectric layer 304, and one or more conductive features 306. The dielectric layer 304 has a dielectric bonding surface 308 and the one or more conductive features 306, which can be formed from copper or some other metal, are formed in the dielectric layer 304 such that the conductive features 306 are exposed at the bonding surface 308. The dielectric bonding surface 308 and conductive feature surface 316 may have sufficient planarity such that the surface 308 is suitable for direct bonding.

Figure 3B:
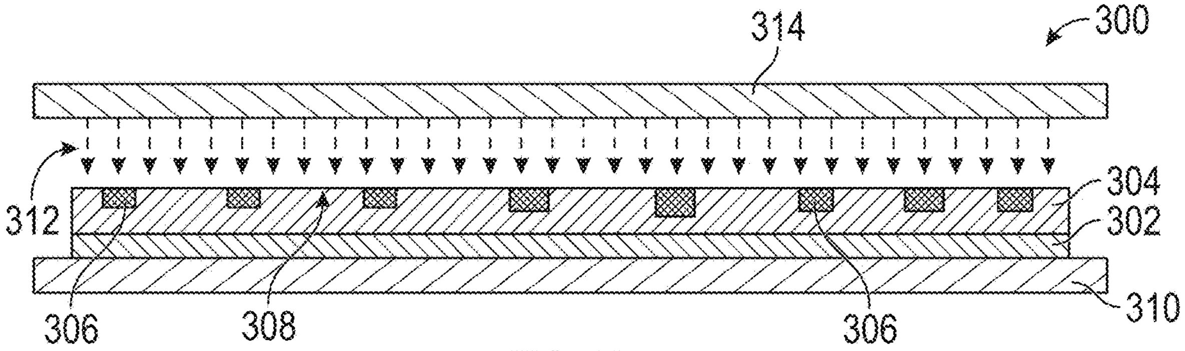

As shown in FIG. 3B, at block 204, the semiconductor element 300 is exposed to products of a water vapor plasma 312. The water vapor plasma 312 is configured to activate the bonding surfaces of the semiconductor element 300. The semiconductor element 300 is mounted to a carrier 310 and the products of the water vapor plasma 312 are dispersed over the surface 308 of the semiconductor element 300. The skilled artisan will appreciate that in some embodiments, the plasma can be an in situ plasma formed directly over the substrate being treated, in which case a distribution system 314 (e.g., showerhead) supplies water vapor and any other vapors for ignition of plasma within the chamber, e.g., by way of RF power alternating between electrodes such as the carrier 310 and the distribution system 314. In other embodiments, the water vapor plasma is generated remotely from the semiconductor element 300 and products of the water vapor plasma 312 are then supplied to the semiconductor element 300 via the distribution system 314. Many remote plasma generators (RPGs) employ microwave energy coupled to a plasma applicator though which the supplied vapors flow, but the skilled artisan will appreciate that the remote plasma can couple other forms of energy to the water vapor and any other supplied vapors. In some embodiments, the water vapor plasma is formed by exposing water to a strong electromagnetic field, which excites the water and causes it to form a plasma. During the plasma formation process, the water vapor reacts with excited free electrons to form neutral monatomic oxygen, oxygen ions, hydroxy ions, hydrogen ions, and neutral monatomic hydrogen. Two such reactions are shown as Reactions 1 and 2 below:

$$H_2O + e^- \rightarrow H + OH + e^- \quad [1]$$

$$H_2O + e^- \rightarrow O + H_2 + e^- \quad [2]$$

Figure 3C:
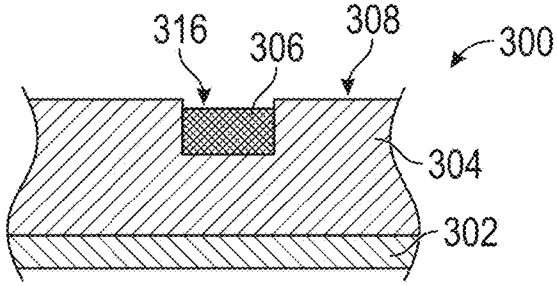

FIG. 3C shows a side schematic view of a portion of the semiconductor element 300 including one of the conductive features 306. The conductive feature 306 has a conductive surface 316 that is recessed below the dielectric bonding surface 308. As noted above, in some embodiments, the conductive surface 316 is recessed below the dielectric bonding surface 308 by less than 20 nm. The smaller the recess the lower the temperature during post-bonding anneal that will cause the conductors from opposite elements to bridge the gap from such recesses. However, because it is difficult to uniformly control the recess depths across the elements, the variation in recess depth for the conductive features 306 across the substrate 302 employed in direct hybrid bonding tends to be between 1 nm and 7 nm or greater, depending on the various processing conditions. Employing water plasma in certain embodiments can facilitate reduced variation of metal recess depth across the substrate 302, such that the variation in metal recess depth may be between 0.2 nm and 2 nm. Employing water plasma in certain embodiments can also facilitate the employment of recesses smaller than 10 nm in depth, such as between 1 nm and 10 nm or between 4 nm and 8 nm. In other embodiments, however, the conductive surface 316 is recessed below the dielectric bonding surface 308 by a different distance. For example, in some embodiments, the conductive surface 316 is recessed below the dielectric bonding surface by 3 nm, 4 nm. 5 nm, 6 nm, 7 nm, 8 nm, or a value in a range defined by any of these values.

When dielectric bonding surfaces are activated by being exposed to an oxygen plasma, the oxygen plasma causes organic material residues at the bonding surfaces to decompose, which can improve bonding performance. However, exposing the dielectric bonding surfaces 308 to an oxygen plasma can oxidize the surface of the conductive features (except for some oxidation-resistant materials such as gold, platinum, iridium, and the like). For example, where the conductive features comprise aluminum, nickel, or copper, ashing the surfaces of the conductive features with an oxygen plasma can result in the formation of a metal oxide layer on the surface of the conductive features. As discussed in greater detail elsewhere in the application, the conductive features can be directly bonded to conductive features on another element. However, some metal oxides, depending on their nature and thickness, can interfere with this direct bonding process and can prevent the direct bond from forming or at least reduce the quality of the bond. For example, while aluminum oxide and nickel oxide will generally be removed before the bonding operation, very thin layers of copper oxide can sometimes be left without removal, because copper oxide tends to be more forgiving than aluminum and nickel oxides, which means that the conductive features will bond more readily. In some cases, the oxygen plasma may activate the dielectric bonding surface. In other cases, however, the nitrogen plasma may activate the dielectric bonding surface to strengthen covalent dielectric bonding at room temperature. In these cases, after exposing the bonding surfaces to the oxygen plasma, the dielectric bonding surfaces may then be exposed to a nitrogen plasma to activate the dielectric surfaces. In some cases, the oxygen plasma may activate the bonding surfaces of the non-conductive features. In practice, after exposing the bonding surface to oxygen plasma, the bonding surface is cleaned with a suitable cleaning agent (for example wet acid solution) and/or by using a suitable cleaning process to remove the oxidized layer from the conductive features of the hybrid bonding surface. However, removing the metal oxide layer from the conductive features using wet cleaning methods typically results in the oxide layer being dissolved by the cleaning agent, thereby increasing the depth of the recess.

Ashed surfaces or activated surfaces of the substrate can be thoroughly rinsed with DI water and thoroughly dried by spin drying or by other known suitable methods. However, such metal oxide removal processes can cause the conductive features to be recessed further. Because some variability in recess depth across the element is introduced by both CMP, which produces the initial recesses, and the subsequent oxidation and oxide removals, the overall recess depths tend to be greater than 8 nm or even greater than 10 nm in order to have the uniformity desired across the element to ensure conductor contacts without local delaminations during hybrid bonding. This larger distance entails higher anneal temperatures to ensure that the conductive features can bond together, which can consume too much thermal budget or cause other thermal problems (e.g., stresses or warping).

In contrast, the water vapor plasma is configured to activate the dielectric bonding surface 308 and to inhibit or prevent formation of copper oxide from the conductive surfaces 316 of the conductive features 306. The products of the water vapor plasma interact with the dielectric bonding surface 308 and breaks chemical bonds at the dielectric bonding surface 308 while simultaneously terminating the dielectric bonding surface 308 with hydroxyl ions, which can aid in the direct bonding process. The water vapor plasma also interacts with the conductive surfaces 316 and reduces the surfaces of the conductive surfaces, thereby inhibiting or preventing oxides from forming on the surfaces 316, or removing any oxides that do form. Advantageously, the water vapor plasma can leave oxide-free conductive surfaces 316 without substantially etching conductive features 306. This means that the wet cleaning methods used to remove metal oxides from the conductive surfaces 316, which typically results in the cleaning agent dissolving the metal oxides and increasing the depth of the recess, can be avoided, along with the additional variability across the substrate that this additional process entails. In this way, exposing the semiconductor element 300 to the water vapor plasma allows for the activation and termination of the bonding surfaces while minimizing the increase in depth that the conductive surface 316 is recessed below the dielectric bonding surface 308. Because one source of recess variability across the substrate is reduced, a smaller recess depth for the conductive surface 316 below the dielectric bonding surface 308 can be targeted, and the post-bonding annealing temperature for joining the conductive features can be reduced.

In some embodiments, exposing the semiconductor element 300 to products of the water vapor plasma includes exposing the semiconductor element 300 to plasma generated from water vapor alone, without supplying another reactant source vapor to the plasma generation apparatus, such as supplying water alone, or water with a noble carrier gas only. In such embodiments, water is the sole reactant supplied to the plasma generation apparatus and to the semiconductor element at block 204.

In other embodiments, however, semiconductor element 300 can be exposed to one or more other reactant source vapors during or prior to the water vapor plasma. Such additional reactant source vapors may be considered inert under some circumstances, such as being supplied to the chamber holding the element to be treated without going through the plasma source apparatus, but are nevertheless considered reactive when supplied through and activated in the plasma source apparatus. For example, in some embodiments, the semiconductor element 300 can be simultaneously exposed to products of a plasma generated by supplying both water vapor and oxygen to the plasma generation apparatus. In some embodiments, a carrier gas can be mixed with the water vapor and supplied to the plasma generation apparatus, exposing the semiconductor element 300 to the products of a plasma formed from both water vapor and the carrier gas. The carrier gas can be configured to help flow the water vapor to the plasma generation device or to supply more mass to help support the plasma generation. While noble gases remain inert or nonreactive even when exposed to plasma, other carrier gases can contribute reactive species to the process. For example, in some embodiments, the carrier gas comprises air. In other embodiments, the carrier gas comprises nitrogen gas, which can activate and contribute some nitrogen termination to the dielectric bonding surface 308 and form stronger covalent bonds at room temperature. In still other embodiments, the carrier gas comprises hydrogen gas, which can boost the oxide prevention or reduction of hydrogen species supplied by the water plasma. The addition of a very small amount fluorine species (e.g., less than 10% of the fluid supplied to the plasma by volume or flow rate, less than 5% or even less than 1%) to the plasma can also provide activation and terminations to strengthen direct dielectric bonding at room temperature. One of the advantages of water plasma treatment of the bonding surface is that it can facilitate in situ activation and termination of the non-conductive bonding surface while reducing or preventing oxide layer formation on the exposed conductive features.

Figure 3D:
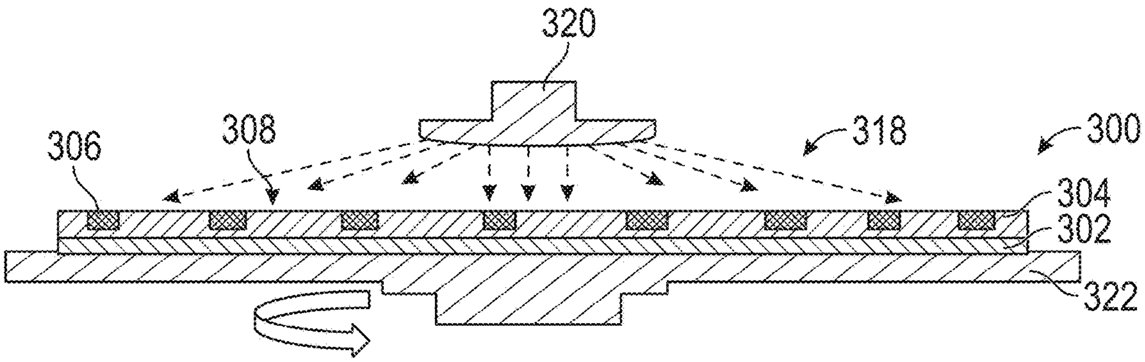

As shown in FIG. 3D, at block 206, after exposing the semiconductor element 300 to the products of the water vapor plasma, the semiconductor element 300 can be cleaned and dried. In some embodiments, the semiconductor element 300 can be cleaned by rinsing the dielectric bonding surface 308 with DI water 318. The DI water 318 can remove unwanted debris the dielectric bonding surface, such as spurious particles from the plasma chamber or sputtered from the dielectric bonding surface and deposited on the dielectric bonding surface. After cleaning the dielectric bonding surface 308, the semiconductor element 300 can be dried. In some embodiments, drying can comprise spin drying. In these embodiments, the semiconductor element 300 can be mounted to a spin-drying apparatus 322 and the semiconductor element 300 can be spin-dried for between 30 seconds and 240 seconds at a rate of 1000 RPM to 4000 RPM. In some embodiment, the cleaning and rinsing step may comprise low molecular weight organic solvents, such as methyl alcohol, isopropanol, or butyl alcohol, and the drying step can be performed according to other know methods, such as Marangoni drying.

Figure 3E:
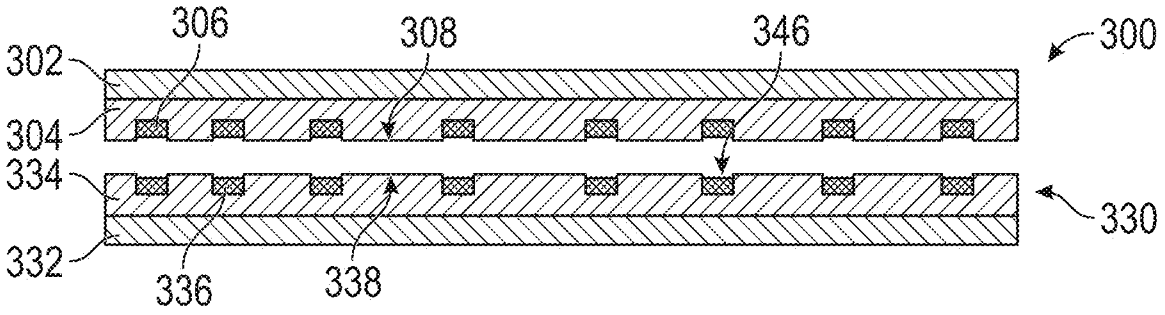

As shown in FIG. 3E, at block 208, the semiconductor element 300 is positioned over a second element, such as the illustrated semiconductor element 330. The second semiconductor element 330 includes a second substrate 332, a second dielectric layer 334, and one or more second conductive features 336. The second dielectric layer 334 has a second dielectric bonding surface 338 and the one or more second conductive features 336, which can be formed from copper or some other metal, are formed in the second dielectric layer 334 such that the second conductive features 336 are exposed at the second bonding surface 338. In some embodiments, the second conductive features 336 have second conductive surfaces 346 that are recessed below the second dielectric bonding surface 338. The second dielectric bonding surface 338 may have sufficient planarity such that the second dielectric bonding surface 338 is suitable for direct bonding. In some embodiments, the semiconductor element 300 is positioned over the second semiconductor element 330 such that the dielectric bonding surface 308 faces the second dielectric bonding surface 338 and such that conductive portions 306 of the semiconductor element 300 are aligned with and directly over second conductive portions 336 of the second semiconductor element 330 and non-conductive portions of the semiconductor element 300 are aligned with and directly over non-conductive portions of the second semiconductor element 330. Specifically, the semiconductor element 300 is positioned over the second semiconductor element 330 such that each of the conductive features 306 is aligned with and directly over one of the second conductive features 336 and non-conductive portions of the dielectric layer 304 are positioned over and aligned with non-conductive portions of the second dielectric layer 334.

In some embodiments, before the semiconductor element 300 is positioned over the second semiconductor element 330, the second semiconductor element 330 is prepared for direct bonding. In some embodiments, preparing the second semiconductor element 330 for direct bonding includes exposing the second dielectric bonding surface 338 to products of a water vapor plasma, cleaning the second semiconductor element 330 by rinsing the second dielectric bonding surface 338 with DI water, and then drying the second semiconductor element 330. In other embodiments, however, the semiconductor element 300 is prepared for bonding using a different process. As is known in the art, both elements in a direct hybrid bonding process may be provided with a suitably planar surface and recessed conductors, but one or both of the elements may be exposed to activation and/or termination processes prior to bonding. In some embodiments, the substrate 300 comprises one or more through-substrate electrodes having exposed conductive surfaces on the backside of the substrate 300. In these embodiments, an additional substrate (not shown) having a prepared bonding surface with conductive features may be directly bonded on the backside of substrate 300 before the higher temperature annealing step. The conductive features on the additional substrate can be directly bonded to the one or more through-substrate electrodes on the backside of the substrate 300.

Figure 3F:
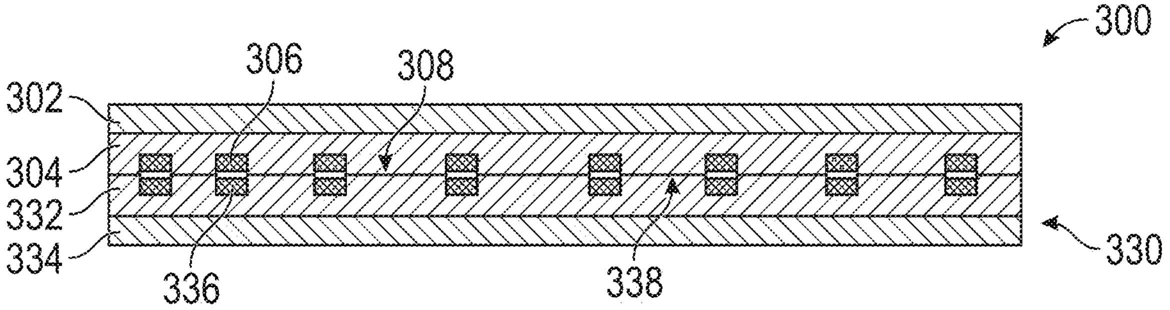

As shown in FIG. 3F, at block 210, the semiconductor elements 300, 330 are directly bonded to each other. In some embodiments, directly bonding the semiconductor elements 300, 330 together includes directly bonding the dielectric bonding surfaces 308, 338 together without an intervening adhesive, as explained above in connection with FIGS. 1A and 1B. In some embodiments, the dielectric bonding surfaces 308, 338 can be directly bonded together using dielectric-to-dielectric bonding techniques. Hydroxyl terminations supplied by exposure to the products of the water vapor plasma at block 204 permit strong bonds at room temperature and without external pressure, sufficient to withstand additional movement of the bonded structure, for example to an anneal station, whether or not additional terminating species are provided. In some embodiments, elevated temperature and/or external pressure can be employed during the initial dielectric bonding. Additional terminating species, such as nitrogen or fluorine, can provide even stronger covalent bonding at room temperature and obviate elevated temperature and external pressure. The dielectric bonding may form covalent bonds even at room temperature.

Figure 3G:
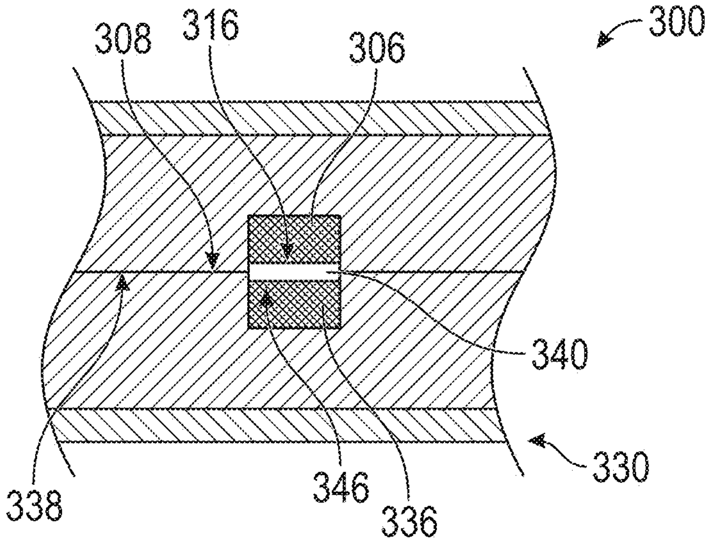

As discussed elsewhere in the application, the conductive surfaces 316, 346 of the conductive features 306, 336 are recessed below the respective dielectric bonding surfaces 308, 338. Accordingly, as shown in FIG. 3G, after directly bonding the dielectric bonding surfaces 308, 338 together, the recessed conductive features 306, 336 are separated from each other by a gap 340. In some embodiments, the conductive features 306, 336 are recessed such that the distance between the conductive surfaces 316, 346 is less than 40 nm, less than 30 nm, less than 20 nm, or less than 16 nm, such as 12 nm. For example, in some embodiments, the distance between the conductive surfaces 316, 346 after directly bonding the dielectric bonding surfaces 308, 338 is 6 nm, 8 nm, 10 nm, 12 nm, 14 nm, or a value in a range defined by any of these values.

Figure 3H:
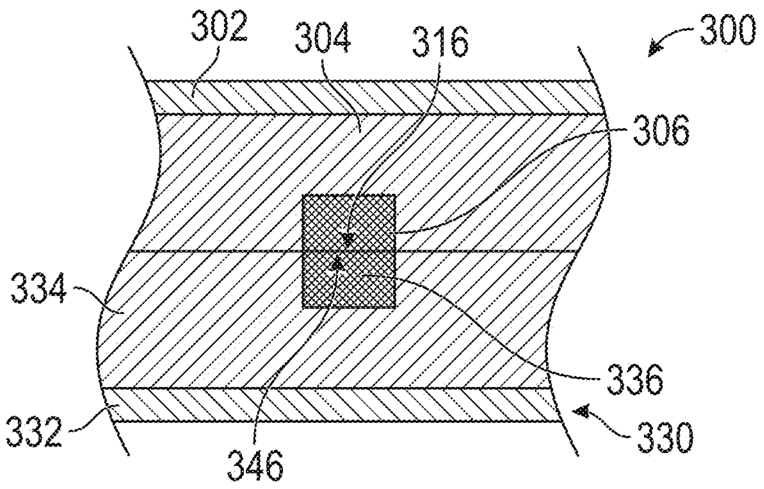

At block 212, the bonded structure is annealed. Upon annealing, the conductive features 306, 336 expand into the gap 340 and contact one another to form a metal-to-metal direct bond. As shown in FIG. 3H, after annealing the conductive features 306, 336 are in direct contact with each other. For a gap 340 size up to 30 nm, an anneal temperature of 250° C. or less can cause the conductive features to expand enough to contact the opposing conductive feature and ensure good electrical connections. Similarly, for a gap 340 size between 12 nm and 15 nm, or a gap 340 size between 15 nm and 20 nm, an anneal temperature between 200° C. and 250° C. can cause the conductive features to expand enough to contact the opposing the conductive feature and ensure good electrical connections. Because embodiments described herein can allow for smaller gaps, the bonded structure can be annealed at lower temperatures. For example, in embodiments where the distance between the conductive surfaces 316, 346 is 12 nm or less, the bonded structure can be annealed at a temperature between 130° C. and 200° C. Further, in embodiments where the distance between the conductive surfaces 316, 346 is 6 nm, the bonded structure can be annealed at a temperature between 160° C. and 180° C. In general, the bonded structure can be annealed at a temperature of 160° C. 170° C. 180° C., 190° C., 200° C., or a value in a range defined by any of these values. Advantageously, annealing the bonded structure at a lower temperature reduces consumption of thermal budgets and thermal stresses.

Figure 3I:
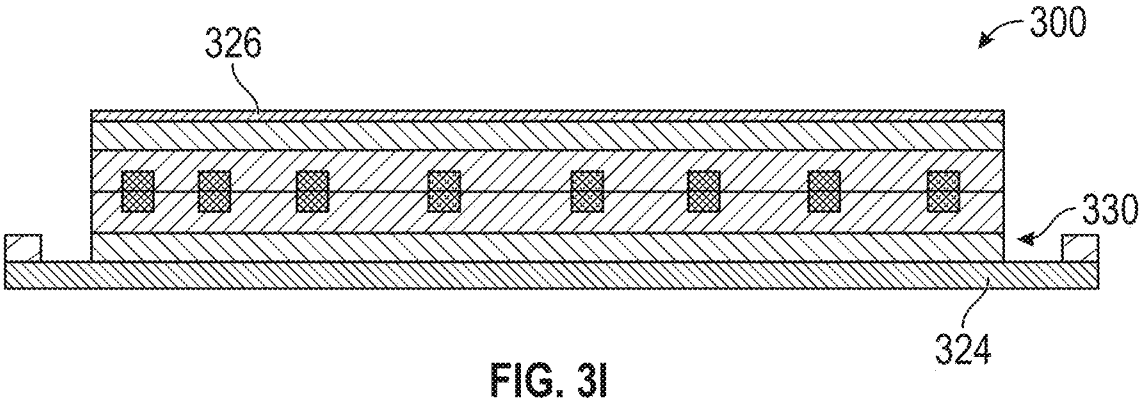

In some embodiments, after directly bonding the semiconductor elements 300, 330 and then annealing the bonded structure, the bonded structure can be processed further before being singulated into a plurality of semiconductor dies. In some embodiments, this further processing may comprise thinning the backside of the substrate 300 and/or the substrate 330. The further processing can also comprise polishing the backside of substrate 300 and/or substrate 330. In some embodiments, an embedded through electrode (e.g., a TSV) formed in one or both of the substrates 300, 330 may be revealed by known methods, thereby exposing the planar or non-planar conductive features on the backside of the substrate 300 and/or the substrate 330. As shown in FIG. 3I, at block 214, the bonded structure is mounted onto a dicing frame 324 and a protective layer 326 is deposited on a back surface of the semiconductor element 300. The protective layer 326 can be configured to protect the back surface of the semiconductor element 300 from debris from the singulation process, which could interfere with subsequent bonding processes.

Figure 3J:
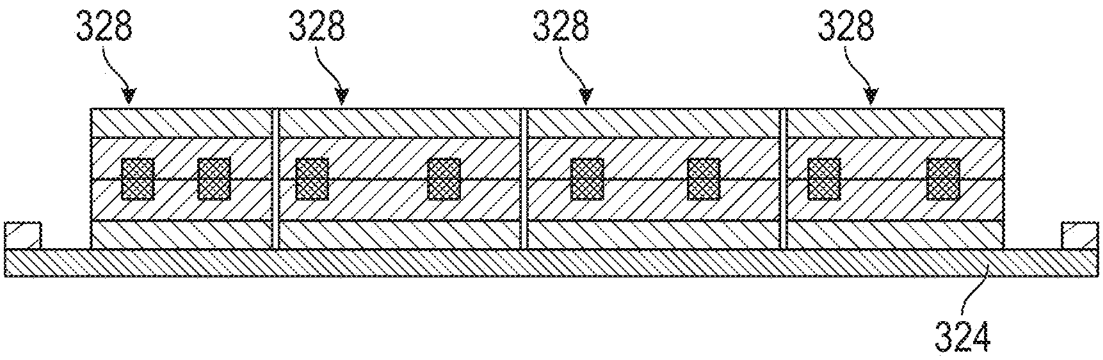

As shown in FIG. 3J, at block 216, the bonded structure is singulated into a plurality of dies 328 and the protective layer 326 is removed. The bonded structure can be singulated using any suitable method and the protective layer 326 can be removed using any suitable means.

Figure 4:
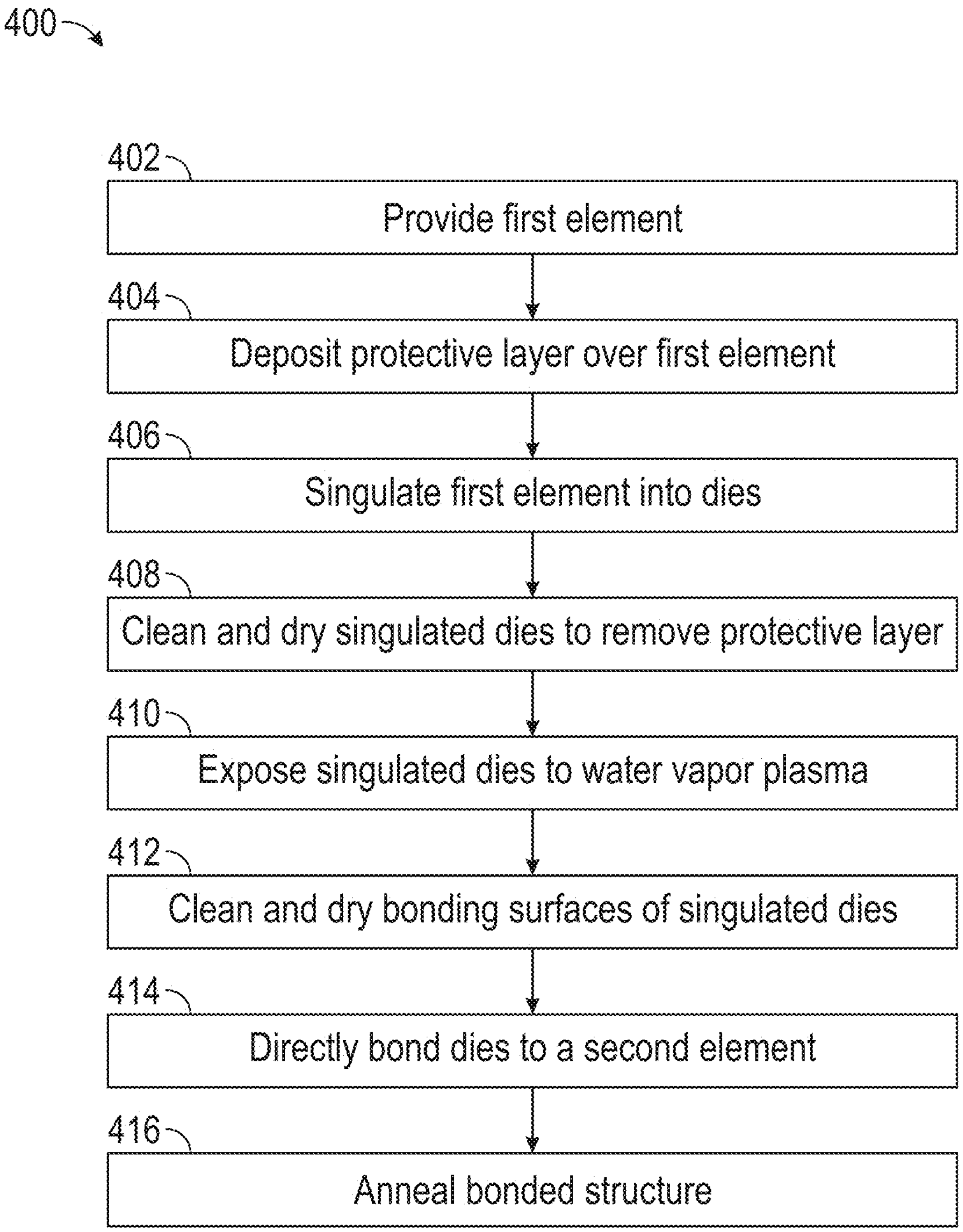
FIG. 4 is a flowchart illustrating a die-to-wafer bonding process that involves exposing an element to water vapor plasma, according to some embodiments.

FIG. 4 is a flowchart illustrating a D2 W bonding process 400 that includes exposing the bonding surface(s) of the dies to water vapor plasma. The skilled artisan will appreciate that the illustrated process 400 can be applied to singulating and bonding devices to other substrates regardless of whether the other substrates are in the shape of wafers, such as D2D processes. FIGS. 5A-5G are schematic side sectional views of semiconductor elements 500, 530 at various blocks of the D2 W process 400 shown in FIG. 4. Unless otherwise noted, features or blocks of FIGS. 4 and 5A-5H may be the same as or generally similar to features or blocks of FIGS. 2 and 3A-3J.

Figure 5A:
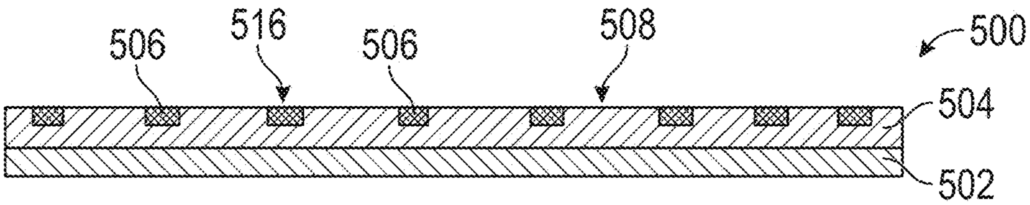
FIGS. 5A-5G are schematic side sectional views of elements at various blocks of a die-to-wafer bonding process like that of FIG. 4.

As shown in FIG. 5A, at block 402, an element to be singulated into multiple elements and then bonded, such as a semiconductor element 500, is provided. The semiconductor element 500 includes a substrate 502, a dielectric layer 504, and one or more conductive features 506. The skilled artisan will appreciate that, for integrated circuits, the substrate 502 may include bulk or single crystal semiconductor materials as well as other device layers and BEOL interconnect layers. The dielectric layer 504 has a dielectric bonding surface 508 and the one or more conductive features 506, which can be formed from copper or some other metal, are formed in the dielectric layer 504 such that the conductive features 506 are exposed at the bonding surface 508. The dielectric bonding surface 508 may have sufficient planarity such that the surface 508 is suitable for direct bonding, as described above. The conductive features 506 have a conductive surface 516 that, in some embodiments, is recessed below the dielectric bonding surface 508.

Figure 5B:
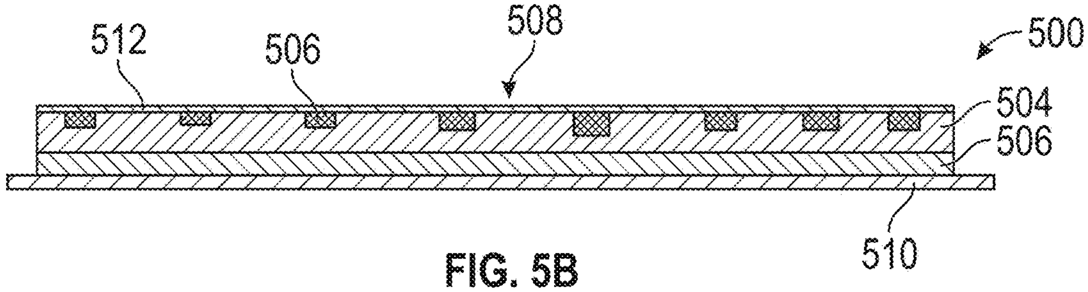

As shown in FIG. 5B, at block 404, the semiconductor element 500 is mounted onto a dicing frame 510 and a protective layer 512 is deposited on the dielectric bonding surface 508. The protective layer can comprise an organic or inorganic layer and can be configured to protect debris from contaminating the dielectric bonding surface 508 during singulation. In one embodiment, the protective layer 512 comprises an organic material, such as photoresist. In some embodiments, the protective layer may be coated over the bonding surface 508 of the semiconductor element 500, before being mounted on the dicing sheet 510.

Figure 5C:
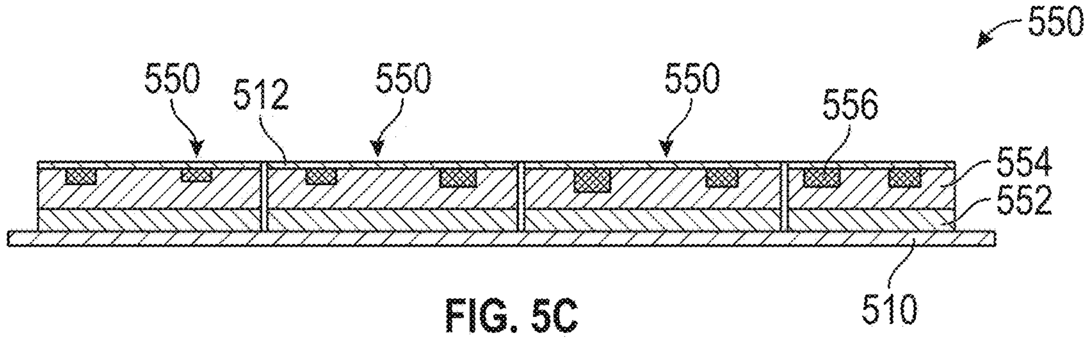

As shown in FIG. 5C, at block 406, the semiconductor element 500 in wafer or other large format is singulated into a plurality of semiconductor elements 550 in singulated die form. The semiconductor element 500 can be singulated using any suitable method, including but not limited to sawing, reactive ion etching (RIE), wet etch, molecular ion beam, laser singulation, or a combination thereof. Each of the singulated semiconductor elements 550 include a substrate 552, a dielectric layer 554, and one or more conductive features 556.

Figure 5D:
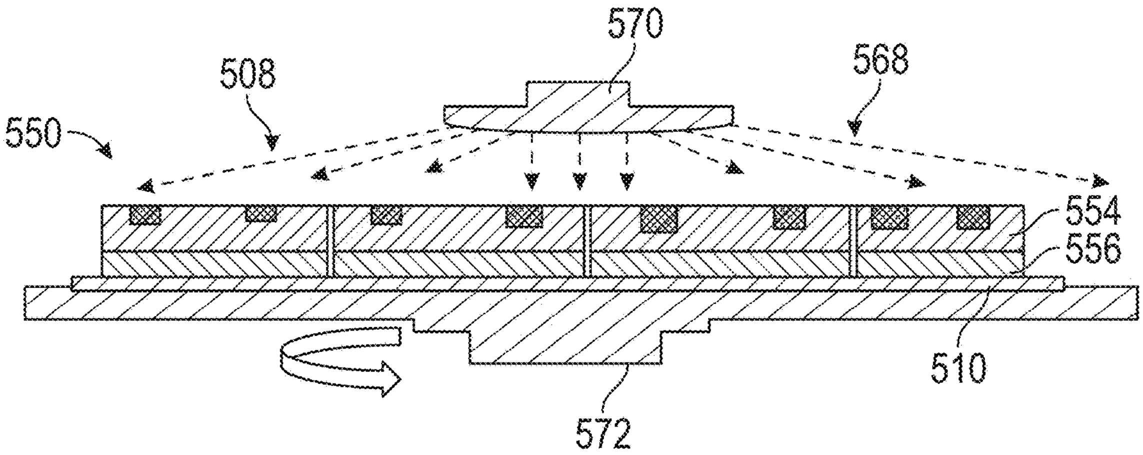

As shown in FIG. 5D, at block 408, the semiconductor elements 550 are cleaned and dried to remove the protective layer 512 from the dielectric bonding surfaces 558 of the semiconductor elements 550. For example, semiconductor elements 550 can be cleaned using a cleaning agent 568 that is applied to the dielectric bonding surfaces 558 with a liquid dispersion device 570. For removing an organic (e.g., photoresist) protective layer 512, the cleaning agent 568 can comprise a suitable solvent, such as an alkaline solution or other suitable cleaning agent as recommended by the supplier of the protective layer. After removing the protective layer 512 from the dielectric bonding surfaces, the singulated semiconductor elements 550 can be rinsed and dried. In some embodiments, drying can comprise spin drying. In these embodiments, the semiconductor elements 550 can be mounted with the dicing frame 510 or other carrier to a spin-drying apparatus 572 and the semiconductor elements 550 can be spin-dried for between 30 seconds and 240 seconds at a rate of 1000 RPM to 4000 RPM.

Figure 5E:
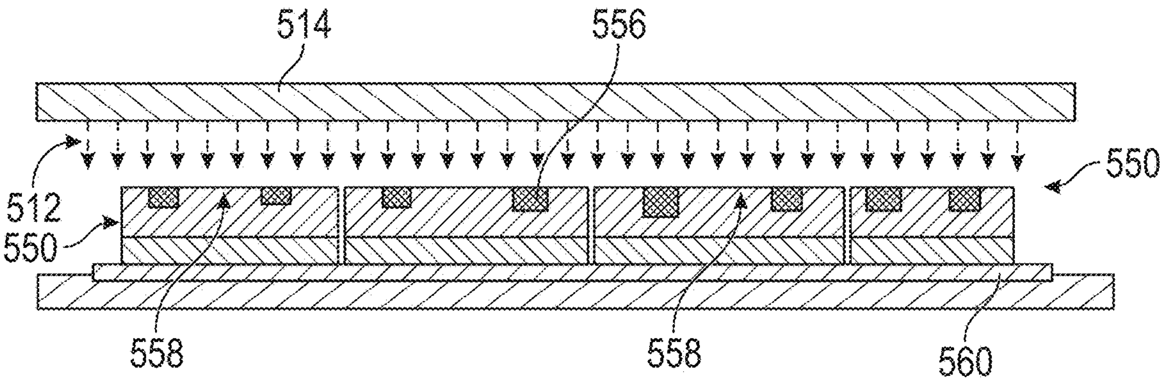

As shown in FIG. 5E, at block 410, in some embodiments, the semiconductor elements 550 are exposed to products of a water vapor plasma 512. The semiconductor elements 550 are mounted to a carrier 560 and products of the water vapor plasma 512 are dispersed over the surface 558 of the semiconductor element 550. As noted above, in situ or remote plasma systems can be employed, such that the distribution system 514 (e.g., showerhead) can either supply vapors for plasma ignition in the same chamber that holds the semiconductor elements 550, or products of a remotely generated plasma are fed through the distribution system 514. As described above in connection with FIGS. 2 and 3B, the products of the water vapor plasma can comprise reactive species of oxygen and hydrogen, such as oxygen ions, monatomic neutral oxygen, hydroxy ions, hydrogen ions, and monatomic neutral hydrogen, and is configured to activate the dielectric bonding layer and terminate it with additional chemical species. The water vapor plasma is also configured to clean the surfaces of the conductive features 556 to inhibit or remove any oxides that form. As noted above, in some embodiments water is the only reactant supplied to the plasma; in some embodiments reactive additives can include hydrogen- or nitrogen-containing vapors supplied through the plasma generation apparatus.

As noted with respect to block 204, exposure of the singulated semiconductor elements 550 at block 408 to products of the water vapor plasma can similarly activate the dielectric bonding surface 508, terminate with hydroxyl groups and possibly other terminating species if supplied to the plasma, and inhibit, prevent, or remove any oxide formed on the conductive surfaces 516, permitting smaller recesses as described above. Additionally, the products of the water vapor plasma can also clean any remaining organic residue left after removal of the protective layer 512. Advantageously, this function of the water vapor plasma can obviate separate ashing steps with oxygen plasma for cleaning organic residue, and thus minimize consumption of conductive surfaces 516 due to oxidation during such ashing steps.

Figure 5F:
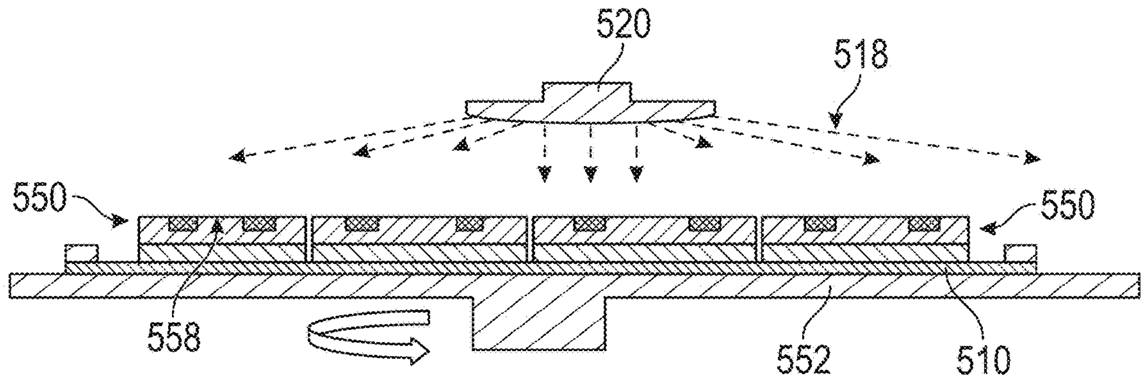

As shown in FIG. 5F, at block 412, after exposing the semiconductor elements 550 to products of the water vapor plasma, the semiconductor elements 550 are cleaned and dried. In some embodiments, the semiconductor elements 550 can be cleaned by rinsing the dielectric bonding surfaces 558 with DI water 518. The DI water 518 is configured to remove unwanted debris from the dielectric bonding surface. In some embodiments, the DI water 518 is dispersed over the dielectric bonding surfaces 558 with a liquid dispersion device 520. After cleaning the dielectric bonding surfaces 558, the semiconductor element can be dried. In some embodiments, drying can comprise spin drying. In these embodiments, the semiconductor elements 550 can be mounted to a spin-drying apparatus 522 and the semiconductor elements 550 can be spin-dried for between 30 seconds and 240 seconds at a rate of 1000 RPM to 4000 RPM. In some embodiments, after the simultaneous activation and termination of the dielectric bonding surface 558 and reduction of any oxide on the conductive features 556, the treated surfaces of the semiconductor elements 550 can be rinsed (e.g., with a low molecular weight alcohol) before the drying step. In some embodiments, the treated surface of the semiconductor elements 550, as well as the dicing frame 510 may be cleaned with an alkaline liquid and rinsed with DI water or another suitable fluid before drying. The cleaning liquid can be selected such that it cleans the bonding surface of the semiconductor elements 550 without contaminating the dielectric bonding surface 558 or significantly degrade the surface of the conductive feature 556.

Figure 5G:
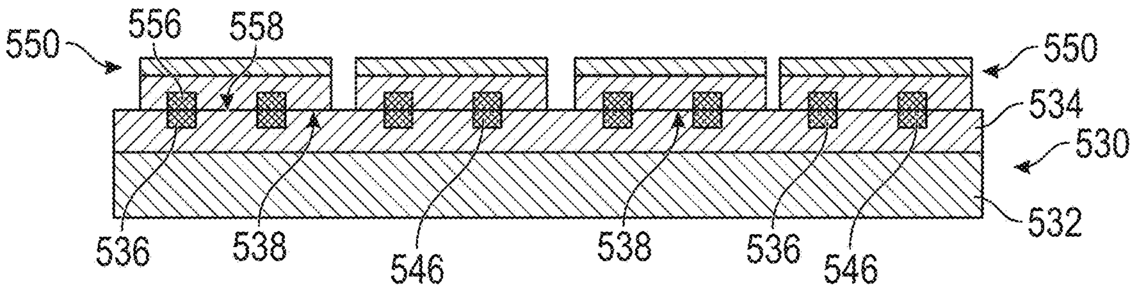

As shown in FIG. 5G, at block 414, after exposure to the products of the water vapor plasma, one or more of the semiconductor elements 550 are directly bonded to the prepared surface of a second element, such as a second semiconductor element 530. The second semiconductor element 530 includes a substrate 532, a dielectric layer 534, and one or more conductive features 536. The skilled artisan will appreciate that, for integrated circuits, the substrate 532 may include bulk or single crystal semiconductor materials as well as other device layers and BEOL interconnect layers. The dielectric layer 534 has a dielectric bonding surface 538 and the one or more conductive features 536, which can be formed from copper or some other metal, are formed in the dielectric layer 534 such that the conductive features 536 are exposed at the bonding surface 538. The conductive features 536 have conductive surfaces 546 that are recessed below the dielectric bonding surface 538 and the dielectric bonding surface 538 has sufficient planarity such that the surface 538 is suitable for direct bonding. In some embodiments, the semiconductor elements 550 are positioned over the second semiconductor element 530 such that the conductive features 556 are aligned with and directly over corresponding the conductive features 536 and non-conductive portions of the dielectric layer 554 are positioned over and aligned with non-conductive portions of the dielectric layer 534.

In some embodiments, before the semiconductor elements 550 are positioned over the second semiconductor element 530, the second semiconductor element 530 is prepared for direct bonding. In some embodiments, preparing the second semiconductor element 530 for direct bonding includes exposing the dielectric bonding surface 538 to water vapor plasma, cleaning the second semiconductor element 530 by rinsing the dielectric bonding surface 538 with DI water or by other suitable cleaning methods, and then drying the second semiconductor element 530. In other embodiments, however, the second semiconductor element 530 is prepared for bonding without separate activation and/or termination, or using different activation and/or termination processes.

After positioning the semiconductor elements 550 over the second semiconductor element 530, the semiconductor elements 550, 530 are directly bonded to each other by directly bonding the dielectric bonding surfaces 558, 538 together without an intervening adhesive, as explained above in connection with FIGS. 1A and 1B. In some embodiments, the dielectric bonding surfaces 558, 538 can be directly bonded together using dielectric-to-dielectric bonding techniques. Hydroxyl terminations supplied by exposure to the products of the water vapor plasma at block 410 permit strong bonds at room temperature and without external pressure, sufficient to withstand additional movement of the bonded structure, for example to an anneal station, whether or not additional terminating species are provided. In some embodiments, elevated temperature and/or external pressure can be employed during the initial dielectric bonding. Additional terminating species, such as nitrogen or fluorine, can provide even stronger covalent bonding between the dielectric bonding surfaces 558, 538 at room temperature.

At block 416, the bonded structure is annealed. As described above in connection with FIGS. 2, 3G, and 3H, the conductive features 536, 556 can be recessed below their respective dielectric bonding surfaces 538, 558 such that, after directly bonding the semiconductor elements 550 to the second semiconductor element 530, the conductive features 536, 556 are separated from each other by a gap. Annealing the bonded structure causes the conductive features 536, 556 to expand and contact one another to form a metal-to-metal direct bond. In some embodiments, due to smaller recesses and consequently smaller gaps in the bonded structure, the bonded structure can be annealed at lower temperature than with larger gaps, such as a temperature of 160° C., 170° C., 180° C., 190° C., 200° C., or a value in a range defined by any of these values or specified annealing conditions.

In some embodiments, after annealing the bonded structure, the bonded structure can be singulated using any suitable method, including, but not limited to, sawing, RIE, wet etching, molecular ion beam, leaser singulation, or a combination thereof. The singulated bonded structure can comprise one or more semiconductor elements 550 directly bonded to a singulated portion of the second semiconductor element 530. In some embodiments, the semiconductor element(s) 550 bonded to the singulated portion of the second semiconductor element 530 can be smaller than the singulated portion of the second semiconductor element 530. In some embodiments, multiple semiconductor elements 550 can be bonded to the singulated portion of the second semiconductor element 530. For example, in some embodiments, multiple semiconductor elements 550 are directly bonded to the prepared surface (including portions of the dielectric bonding surface 538) of singulated portion of the second semiconductor element 530. In some embodiments, after annealing the bonded structure, some or all of the bonded structure can be encapsulated in a polymeric layer prior to the bonded structure being singulated. In some embodiments, the singulated bonded structure can be encapsulated with a molding layer.

Figure 6:
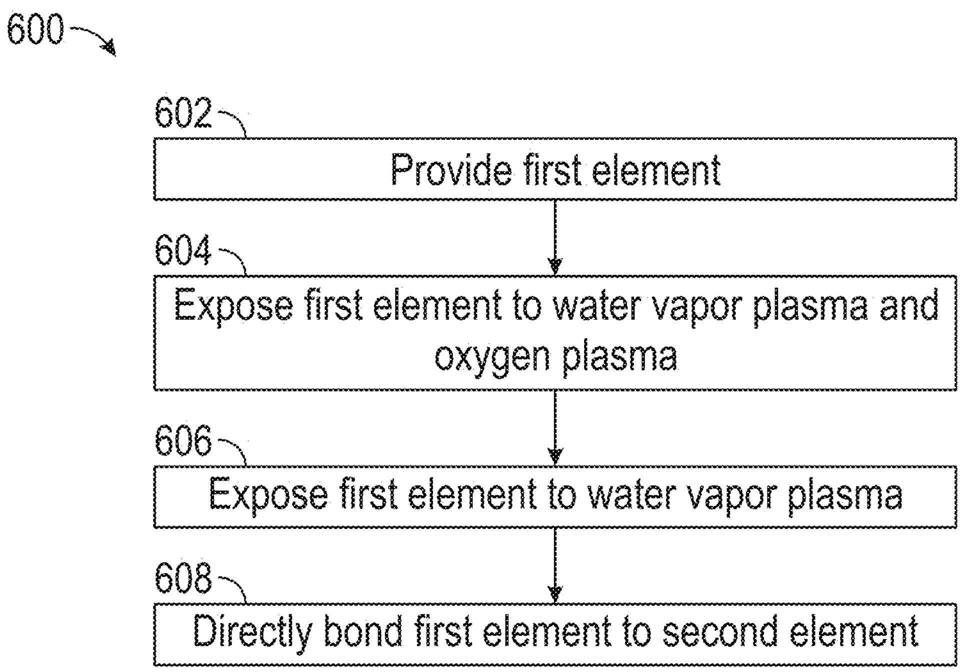
FIG. 6 is a flowchart illustrating a bonding process that involves exposing an element to water and oxygen plasma followed by water vapor plasma, according to some embodiments.
Figure 7:
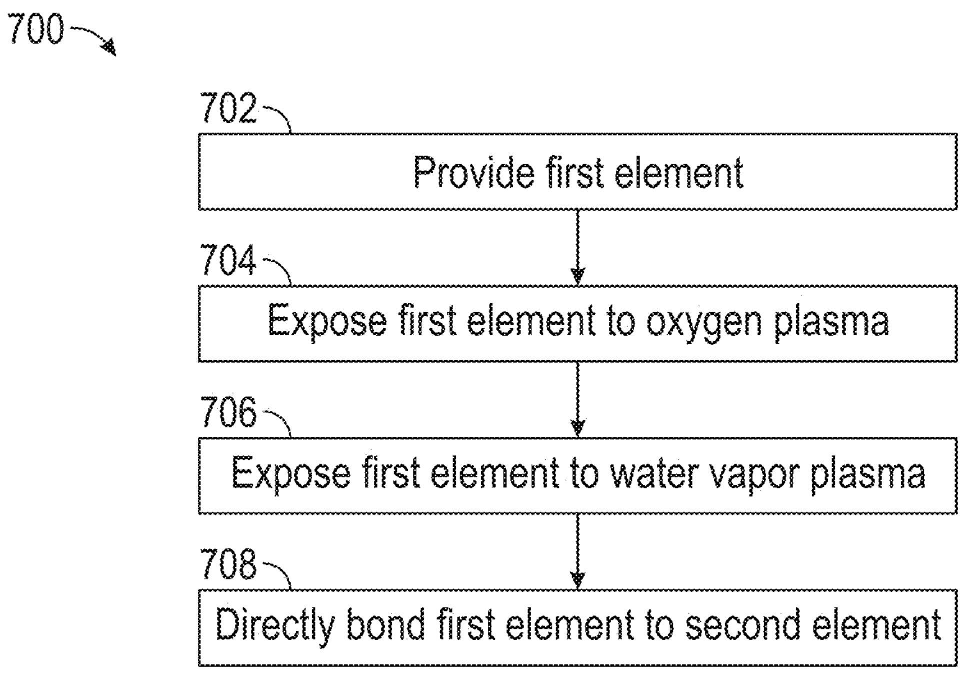
FIG. 7 is a flowchart illustrating a bonding process that involves exposing an element to oxygen plasma and then water vapor plasma, according to some embodiments.

In the embodiments described above in connection with FIGS. 2-5G, the dielectric bonding surfaces are exposed to water vapor plasma without being exposed to any other plasma. In other embodiments, however, the dielectric bonding surfaces can also be exposed to oxygen plasma. FIGS. 6 and 7 are flowcharts illustrating alternative bonding processes that include exposing semiconductor elements to both water vapor plasma and oxygen plasma. Unless otherwise noted, features or steps of FIGS. 6 and 7 may be the same as or generally similar to features or steps of FIGS. 2-5G.

FIG. 6 is a flowchart illustrating a bonding process 600 that includes initially exposing a bonding surface to both water vapor plasma and oxygen plasma and then exposing the bonding surface to just water vapor plasma. At step 602, an element such as a semiconductor element is provided. The semiconductor element includes a substrate (which as noted above can include bulk or single crystal semiconductor material and BEOL layers), a dielectric layer having a dielectric bonding surface, and one or more conductive features formed in the dielectric layer such that the conductive features are exposed at the bonding surface. In some embodiments, the semiconductor element is provided in wafer form. In other embodiments, the semiconductor element is provided in singulated die form. In some embodiments, the element comprises a substrate or package having planar redistribution layer (RDL) that forms a bonding surface for the element. In some embodiments, the substrate or package may comprise a partially- or fully-embedded die or device beneath the bonding surface of the substrate or package.

At block 604, the dielectric bonding surface is exposed to products of a water vapor and oxygen plasma. The products of the oxygen and water vapor plasma are configured to activate the dielectric bonding surface. The products of water vapor plasma are also configured to clean the exposed surfaces of the conductive features so as to inhibit, prevent, or remove any oxides that may form on the conductive surfaces. In some embodiments, the dielectric bonding surface is also exposed to a carrier gas. In some embodiments, after exposing the dielectric bonding surface to the products of oxygen and water vapor plasma, the dielectric bonding surface can be rinsed with DI water and then dried.

At block 606, the dielectric bonding surface is exposed to products of a water vapor plasma. As described elsewhere in the application, the products of the water vapor plasma are configured to clean the surfaces of the conductive features and also to terminate the dielectric bonding surface with hydroxyl groups to improve the bonding energy during direct bonding. In some embodiments, the dielectric bonding surface is also exposed to a carrier gas, which can include other reactive (e.g., terminating) species as disclosed above. Block 606 may directly follow block 604 without intervening treatments. In some embodiments, after exposing the dielectric bonding surface to products of the water vapor plasma, the dielectric bonding surface can be rinsed with DI water and then dried.

At block 608 the first semiconductor element is directly bonded to a second semiconductor element. In some embodiments the first and second semiconductor elements are directly bonded together without an intervening adhesive. In some embodiments, directly bonding the first and second semiconductor elements comprises annealing the bonded structure to form a metal-to-metal direct bond between the conductive features on the first semiconductor element and conductive features on the second semiconductor element. In some embodiments, before directly bonding the first and second semiconductor elements, the second semiconductor element is prepared for direct bonding, where preparing the second semiconductor element for direct bonding includes exposing the dielectric bonding surface to water vapor plasma. In other embodiments, the second semiconductor element is prepared for direct bonding using a different process. Hydroxyl terminations supplied by exposure to the products of the water vapor plasma at block 606 permit strong bonds at room temperature and without external pressure, sufficient to withstand additional movement of the bonded structure, for example to an anneal station, whether or not additional terminating species are provided. In some embodiments, elevated temperature and/or external pressure can be employed during the initial dielectric bonding. Additional terminating species, such as nitrogen or fluorine, can provide even stronger covalent bonding between the dielectric bonding surfaces at room temperature.

FIG. 7 is a flowchart illustrating a bonding process 700 that includes initially exposing a bonding surface to oxygen plasma and then exposing the bonding surfaces to water vapor plasma. At block 702, an element such as a semiconductor element is provided. The semiconductor element includes a substrate (which as noted above can include bulk or single crystal semiconductor material and BEOL layers), a dielectric layer having a dielectric bonding surface, and one or more conductive features formed in the dielectric layer such that the conductive features are exposed at the bonding surface. In some embodiments, the semiconductor element is provided in wafer form. In other embodiments, the semiconductor element is provided in singulated die form. In some embodiments, the element comprises a substrate or package having a planar RDL that forms a bonding surface for the element. In some embodiments, the substrate or package comprises a partially embedded or fully embedded die or device beneath the bonding surface of the substrate or package.

At block 704, the dielectric bonding surface is exposed to products of an oxygen plasma. The products of the oxygen plasma are configured to activate the dielectric bonding surface.

At block 706, the dielectric bonding surface is exposed to products of a water vapor plasma. As described elsewhere in the application, the products of the water vapor plasma are configured to clean the surfaces of the conductive features and also to terminate the dielectric bonding surface with hydroxyl groups to improve the bonding energy during direct bonding. In some embodiments, the dielectric bonding surface is also exposed to a carrier gas, which can include other reactive (e.g., terminating) species as disclosed above. Block 706 may directly follow block 704 without intervening treatments. In some embodiments, after exposing the dielectric bonding surface to water vapor plasma, the dielectric bonding surface can be rinsed with DI water or other suitable solvent or fluid and then dried.

At block 708 the first semiconductor element is directly bonded to a second semiconductor element. In some embodiments the first and second semiconductor elements are directly bonded together without an intervening adhesive. In some embodiments, directly bonding the first and second semiconductor elements comprises annealing the bonded structure to form a metal-to-metal direct bond between the conductive features on the first semiconductor element and conductive features on the second semiconductor element. In some embodiments, before directly bonding the first and second semiconductor elements, the second semiconductor element is prepared for direct bonding, where preparing the second semiconductor element for direct bonding includes exposing the dielectric bonding surface to water vapor plasma. In other embodiments, the second semiconductor element is prepared for direct bonding using a different process. Hydroxyl terminations supplied by exposure to the products of the water vapor plasma at block 706 permit strong bonds at room temperature and without external pressure, sufficient to withstand additional movement of the bonded structure, for example to an anneal station, whether or not additional terminating species are provided. In some embodiments, elevated temperature and/or external pressure can be employed during the initial dielectric bonding. Additional terminating species, such as nitrogen or fluorine, can provide even stronger covalent bonding between the dielectric bonding surfaces at room temperature.

Figure 8:
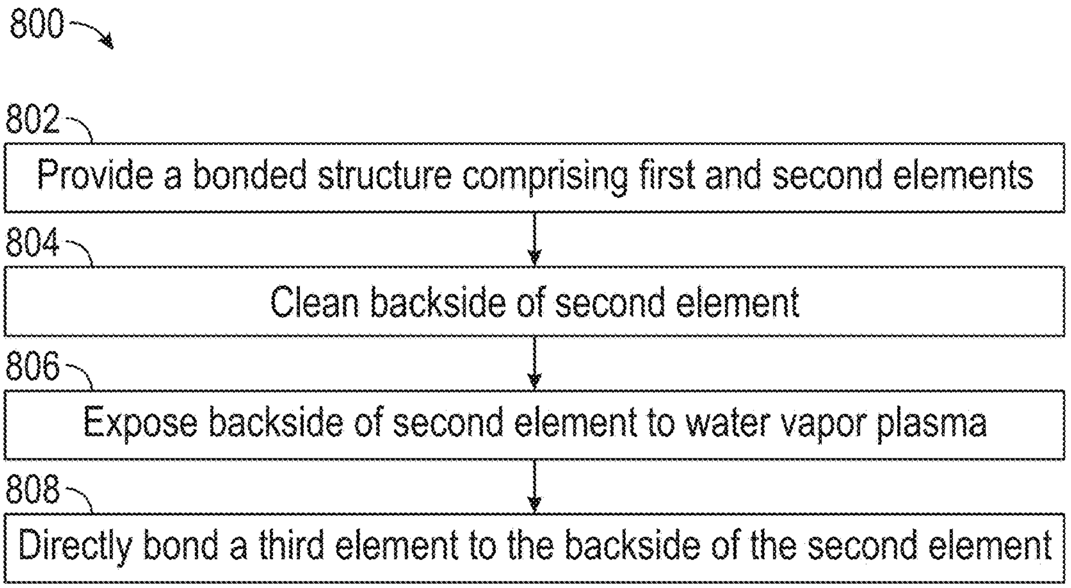
FIG. 8 is a flowchart illustrating a bonding process that involves exposing the backside of a bonded structure to water vapor plasma, according to embodiments.
Figures 10, 11A:
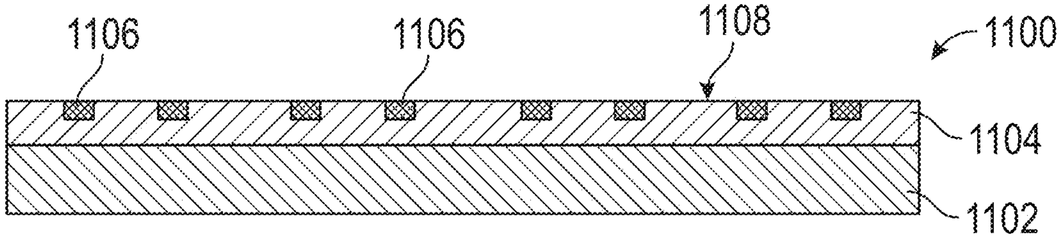
FIG. 10 is a flowchart illustrating a bonding process that involves exposing a substrate that includes polymer materials to water vapor plasma, according to embodiments.
FIGS. 11A-11C are schematic side sectional views of semiconductor elements at various blocks of the bonding process shown in FIG. 10.

In the embodiments described above in connection with FIGS. 2-7, the products of the water vapor plasma can activate and terminate the dielectric bonding surfaces, such as front sides, of microelectronic elements to prepare the semiconductor elements for direct hybrid bonding. In other embodiments, other surfaces of the elements to be bonded can be exposed to the water vapor plasma. FIGS. 8 and 10 are flowcharts illustrating alternative bonding processes that include exposing other surfaces of elements to the products of a water vapor plasma.

FIG. 8 is a flowchart illustrating an alternative bonding process 800 that includes exposing a backside of a semiconductor element in a bonded structure to the products of a water vapor plasma. FIGS. 9A-9D are schematic side sectional views of a bonded structure 900 at various blocks of the bonding process 800 shown in FIG. 8. Unless otherwise noted, features or blocks of FIGS. 8 and 9A-9D may be the same as or generally similar to features or blocks of FIGS. 2-7.

Figure 9A:
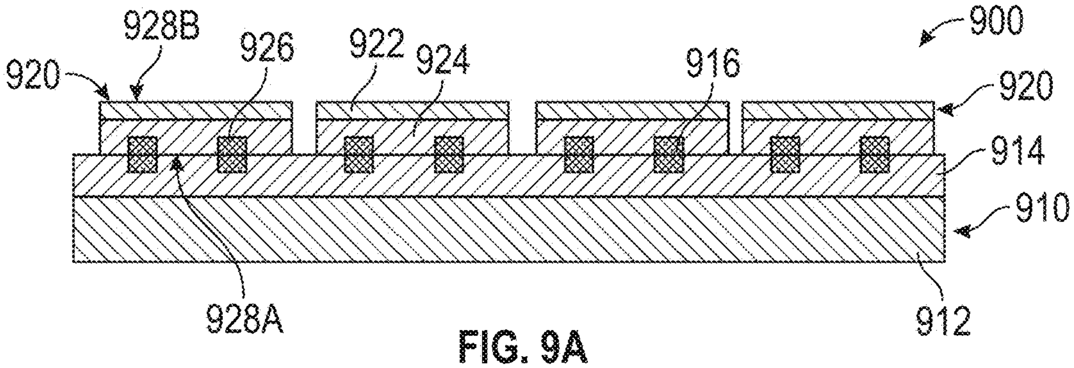
FIGS. 9A-9D are schematic side sectional views of the bonded structure at various blocks of a bonding process like that of FIG. 8.

As shown in FIG. 9A, at block 802, a bonded structure 900 is provided. The bonded structure 900 includes a first element, such as a first semiconductor element 910, and a plurality of second elements, such as a plurality of second semiconductor elements 920, directly bonded to the first semiconductor element 910. In the illustrated embodiment, the first semiconductor element 910 is provided in wafer form while the second semiconductor elements 920 are provided in singulated die form. In other embodiments, however, the second semiconductor elements 920 can also be provided in wafer form. In such embodiments, only a single semiconductor element 920 may be directly bonded to the first semiconductor element 910.

The semiconductor element 910 includes a substrate 912 (which as noted above can include a bulk or single crystal semiconductor material and may also have one or more BEOL layers; other elements can include a package with partially or fully embedded dies, or a temporary substrate having a bonding surface comprising an RDL layer with conductive features), a dielectric layer 914, and one or more conductive features 916 formed in the dielectric layer 914. Similarly, the semiconductor elements 920 each include a substrate 922 (which can similarly include bulk or single crystal semiconductor material and can also have one or more BEOL layers; other elements can include a singulated package, or a substrate having a bonding surface comprising an RDL layer with conductive features), a dielectric layer 924, and one or more conductive features 926 formed in the dielectric layer 924. The second semiconductor elements 920 each have a frontside 928A and a backside 928B having a bonding surface comprising one or more conductive features adapted for hybrid bonding. The frontside 928A includes the dielectric layer 924 and the conductive features 926 and the backside 928B is defined by the substrate 922 or any additional backside layers (e.g., bonding layer(s)). The semiconductor element 910 and the second semiconductor elements 920 can be directly bonded together such that the dielectric layers 914, 924 are directly bonded to each other without an intervening adhesive and the conductive features 916, 926 are directly bonded to each other and form a metal-to-metal direct bond. With this arrangement, the frontsides 928A of the second semiconductor elements 920 faces and directly contacts the semiconductor element 910 while the backsides 928B face away from the semiconductor element 910. The bonded structure 900 can be formed, for example, by the process of FIG. 4. In some embodiments, before subsequent processing, the bonded structure 900 can be annealed or exposed to a heat source to enhance the bond strength of the bonded structure 900.

Figure 9B:
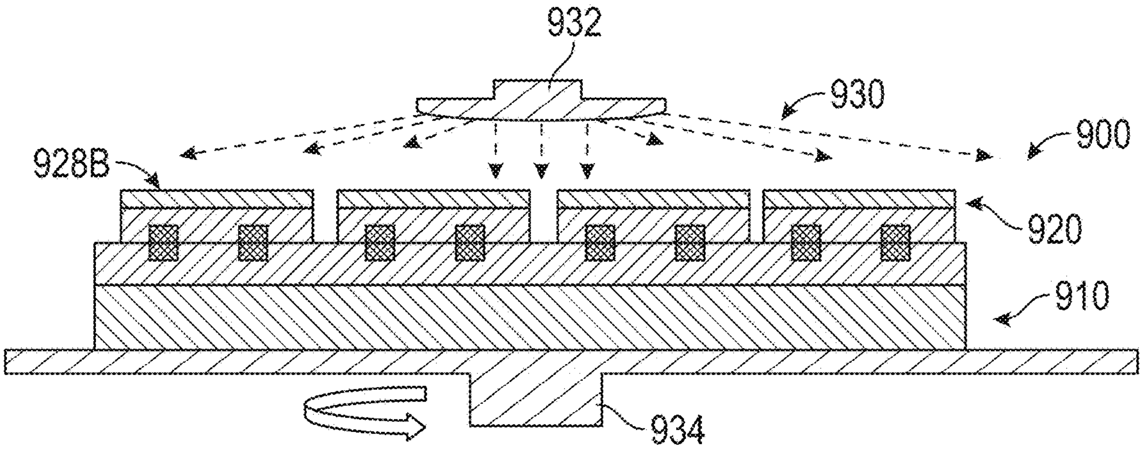

As shown in FIG. 9B, at block 804, the backsides 928B of the second semiconductor elements 920 are cleaned. The backsides 928B are cleaned using a cleaning agent 930 that is applied to the backsides 928B with a liquid dispersion device 932. In some embodiments, the cleaning agent 930 comprises a suitable solvent, such as an alkaline solution or other suitable cleaning agent. The cleaning agent 930 is configured to remove contaminants on the backsides 928B of the semiconductor element 920. In some embodiments, the cleaning agent comprises DI water. After cleaning the backsides 928B, the bonded structure can be dried. In some embodiments, drying can comprise spin drying or other known drying methods. In these embodiments, the bonded structure 900 can be mounted to a spin-drying apparatus 934 and the bonded structure 900 can be spin-dried for between 30 seconds and 240 seconds at a rate of 1000 RPM to 4000 RPM.

Figure 9C:
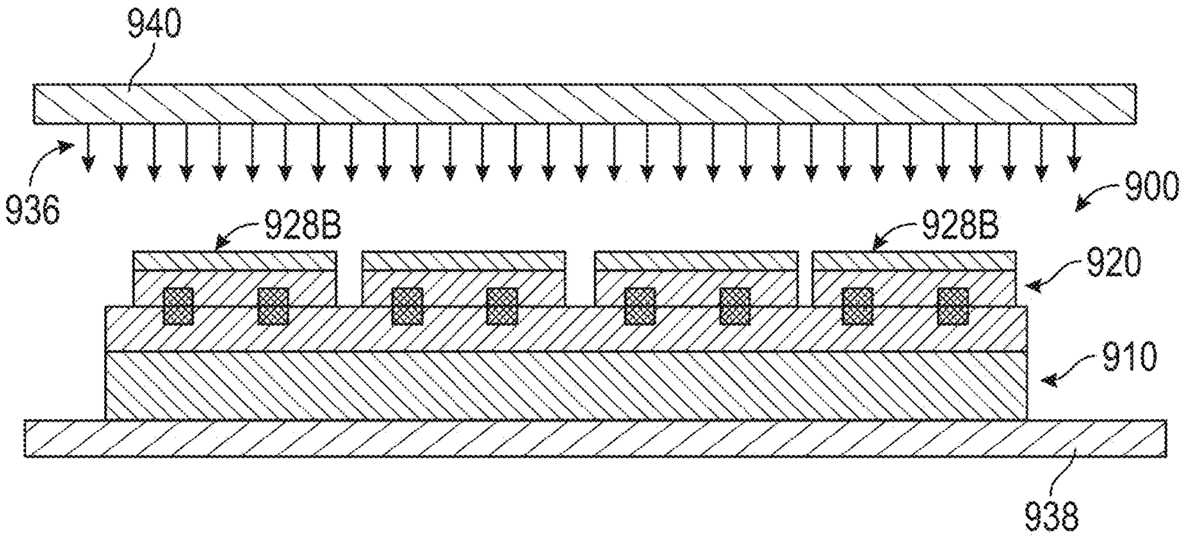

As shown in FIG. 9C, at block 806, the backsides 928B of the second semiconductor elements 920 are exposed to products of a water vapor plasma 936. The bonded structure 900 is mounted to a carrier 938 and the products of the water vapor plasma 936 are dispersed over the backsides 928B to treat the backside bonding surface. In some embodiments, a distribution system 940 is used to disperse products of water vapor plasma over the backsides 928B. As described in greater detail elsewhere in the specification, the products of water vapor plasma 936 can comprise reactive species of oxygen and hydrogen, such as oxygen ions, atomic oxygen, hydroxy ions, hydrogen ions, and atomic hydrogen and are configured to activate the backsides 928B of the semiconductor elements 920 and to terminate it with additional chemical species to improve the bonding energy during direct bonding. In some embodiments, the backsides 928B are also exposed to plasma products of a carrier gas, which can include additional terminating species such as nitrogen or fluorine. In some embodiments, after exposing the backsides 928B to the water vapor plasma, the backsides are cleaned with DI water and then dried. In some embodiments, the backsides 928B have only semiconductor or inorganic dielectric surfaces that can be terminated with hydroxyl and possible other terminating species by exposure to products of the water vapor plasma. In other embodiments, the backsides 928B also include conductive surfaces (not shown) such as contact pads or exposed ends of through substrate vias (TSVs), in which case exposure to the products of water vapor plasma also inhibit, prevent or remove oxides from the conductive surfaces, as described above.

Figure 9D:
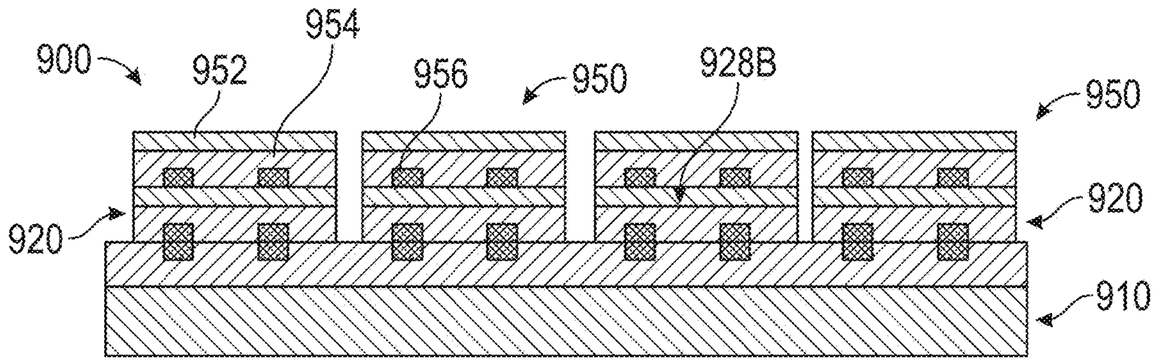

As shown in FIG. 9D, at block 808, a third element such as a third semiconductor element 950 having a prepared bonding surface is directly bonded to each of the backsides 928B of the second semiconductor elements 920. The third semiconductor elements 950 include a substrate 952 (which can include bulk or single crystal semiconductor material as well as BEOL layers; other elements can include a singulated package, or a substrate having a bonding surface comprising of an RDL layer with conductive features), a dielectric layer 954, and one or more conductive features 956 formed in the dielectric layer 954. In the illustrated embodiment, the third semiconductor elements 950 are directly bonded to the backsides 928B such that the dielectric layers 954 and the conductive features 956 face towards the backsides 928B and at least the dielectric layers 954 are directly bonded to the backsides 928B without an intervening adhesive. Block 808 can include initial room temperature direct bonding of non-conductive surfaces and subsequent anneal. Block 808 can represent direct hybrid bonding where the conductive features 956 are bonded to backside conductive features (not shown) of the second semiconductor elements 920, in which case a gap between corresponding conductors can be bridged by thermal expansion during anneal. In some embodiments, before directly bonding the third semiconductor element 950 to the backsides 928B, the third semiconductor element 950 is prepared for direct bonding, where preparing the third semiconductor element 950 for direct bonding includes exposing the dielectric layer 954 to the products of a water vapor plasma. In other embodiments, the third semiconductor element is prepared for direct bonding using a different process.

In some embodiments, after annealing the bonded structure, the bonded structure can be singulated using any suitable method, including, but not limited to, sawing, RIE, wet etching, molecular ion beam, leaser singulation, or a combination thereof. The singulated portion of the bonded structure can comprise one or more stacks of the directly bonded second and third semiconductor elements 920, 950 directly bonded to a singulated portion of the semiconductor element 910. In some embodiments, the stack(s) of second and third semiconductor elements 920, 950 bonded to the singulated portion of the semiconductor element 910 can be smaller (e.g., can have a smaller footprint) than the singulated portion of the semiconductor element 910. In some embodiments, multiple stacks of the directly bonded second and third semiconductor elements 920, 950 can be bonded to the singulated portion of the semiconductor element 910. For example, in some embodiments, multiple stacks of the directly bonded second and third semiconductor elements 920, 930 are directly bonded to the prepared bonding surface of a singulated portion of the semiconductor element 910 (e.g., the surface on which the frontsides 928A are directly bonded to). In some embodiments, after annealing the bonded structure, some or all of the bonded structure can be encapsulated in a polymeric layer prior to the bonded structure being singulated. In some embodiments, the singulated bonded structure can be encapsulated with a molding layer. In some embodiments, the backsides of the third semiconductor elements 950 (e.g., the sides of the third semiconductor elements 950 that are not directly bonded to the second semiconductor elements 920) can be prepared for bonding (e.g., direct bonding) of additional semiconductor elements.

Figure 11B:
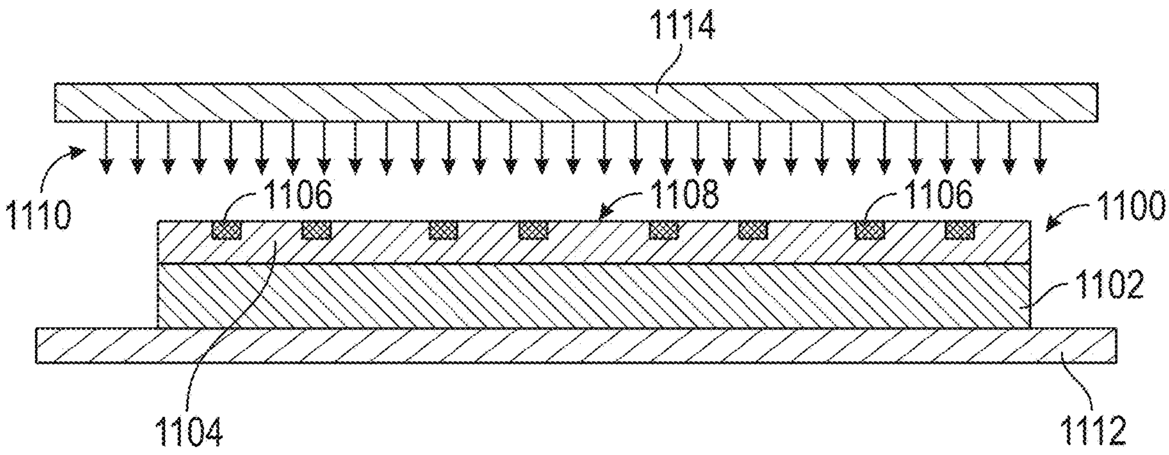
Figure 11C:
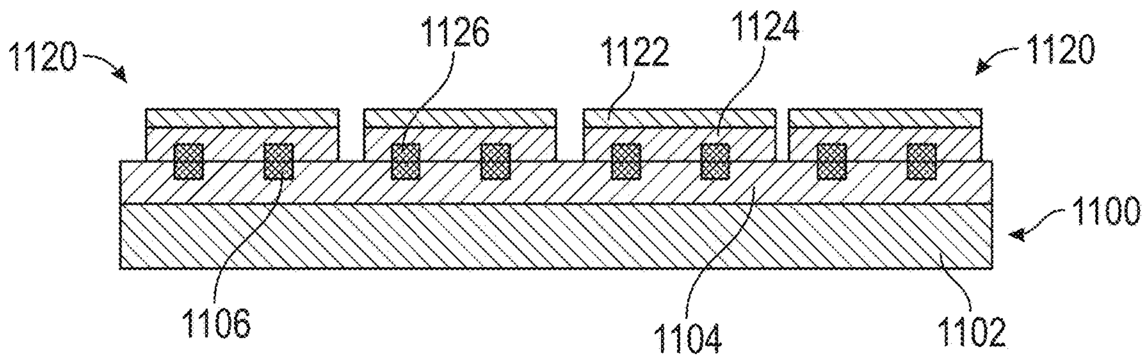

FIG. 10 is a flowchart illustrating an alternative bonding process 1000 that includes exposing an element that includes a polymeric material to the products of a water vapor plasma. FIGS. 11A-11C are schematic side sectional views of the element at various blocks of the bonding process 1000 shown in FIG. 10. Unless otherwise noted, features or blocks of FIGS. 10 and 11A-11C may be the same as or generally similar to features or blocks of FIGS. 2-9.

As shown in FIG. 11A, at block 1002, an element 1100 is provided. The element 1100 comprises a substrate 1102, a dielectric layer 1104, and one or more conductive features 1106 formed in the dielectric layer 1104. The element 1100 includes a bonding surface 1108 formed at the dielectric layer 1104. In some embodiments, the substrate 1102 can comprise polymeric material, such as a flex substrate. In some embodiments, the substrate 1102 comprises a package with one or more partially or fully embedded dies. In other embodiments, the substrate 1102 can comprise a temporary substrate having a bonding surface comprising a BEOL layer or an RDL layer with one or more conductive features. In still other embodiments, the conductive features 1106 can be adapted for hybrid bonding and can be partially embedded in the bonding surface of the substrate 1102.

As shown in FIG. 11B, at block 1004, the surface 1108 of the dielectric layer 1104 is exposed to products of a water vapor plasma 1110. The element 1100 is mounted to a carrier 1112 and the products of the water vapor plasma 1110 are provided to the bonding surface 1108 in a plasma chamber. In some embodiments, the products of the water vapor plasma 1110 are provided to the bonding surface 1108 using a plasma distribution system 1114. As described in greater detail elsewhere in the specification, the products of the water vapor plasma 1110 can comprise reactive species of oxygen and hydrogen, such as oxygen ions, atomic oxygen, hydroxy ions, hydrogen ions, and atomic hydrogen. In some embodiments, the water vapor plasma is also configured to clean the surface of the conductive features 1106. In some embodiments, the surface 1108 of the dielectric layer 1104 is also exposed to plasma products of a carrier gas, which can include additional terminating species such as nitrogen or fluorine. In some embodiments, after exposing the bonding surface 1108 of the dielectric layer 1104 to the water vapor plasma, the bonding surface 1108 is cleaned with DI water or another suitable solvent and then dried.

As shown in FIG. 11C, at block 1006, one or more elements, such as element 1120, are bonded to the prepared bonding surface 1108. In the illustrated embodiment, the element 1120 is provided in singulated die form. In other embodiments, however, the element 1120 is provided in wafer form. In such embodiments, only the single element 1120 may be bonded to the element 1100. The element 1120 includes a substrate 1122 (which as noted above can include a bulk or single crystal semiconductor material as well as BEOL layers; other elements can include a singulated dielectric layer, or a singulated package), a dielectric layer 1124, and one or more conductive features formed in the dielectric layer 1124. As described above, employing products of water plasma can lower thermal budgets, which can be particularly advantageous for directly bonding substrates that include temperature sensitive polymer materials, such as flex.

In some embodiments, the bonded structure (e.g., the structure formed from the element 1100 and the one or more elements 1120 bonded to the element 1100) can be singulated using any suitable method, including, but not limited to, sawing, RIE, wet etching, molecular ion beam, leaser singulation, or a combination thereof. The singulated portion of the bonded structure can comprise one or more of the elements 1120 bonded to a singulated portion of the element

1100. In some embodiments, the element(s) 1120 bonded to the singulated portion of the element 1100 can be smaller (e.g., can have a smaller footprint) than the singulated portion of the element 1100. In some embodiments, multiple elements 1120 can be bonded to the singulated portion of the element 1100. For example, in some embodiments, multiple elements 1120 are bonded to the prepared bonding surface (e.g., bonding surface 1108, shown in FIGS. 11A and 11B) of a singulated portion of the element 1100. The multiple elements 1120 can be spaced apart from each other by a specified pitch. In some embodiments, some or all of the bonded structure can be encapsulated in a polymeric layer prior to the bonded structure being singulated. In some embodiments, the singulated bonded structure can be encapsulated with a molding layer. In some embodiments, the backsides of the elements 1120 (e.g., the sides elements 1120 that are not bonded to the singulated portion of the element 1100) can be prepared for bonding (e.g., direct bonding) of additional elements.

In accordance with one aspect, a process is provided. The process can include providing an element having a dielectric bonding surface and a conductive feature exposed at the dielectric bonding surface. The dielectric bonding surface having a planarity suitable for direct bonding. The process also includes exposing the dielectric bonding surface to products of a water vapor plasma prior to direct bonding.

In some embodiments, the process further includes cleaning and drying the dielectric bonding surface. In some embodiments, the element includes a first element, the dielectric bonding surface includes a first dielectric bonding surface, and the conductive feature includes a first conductive feature, where the process further includes providing a second element having a second dielectric bonding surface and a second conductive feature exposed at the second dielectric bonding surface, where the second dielectric bonding surface has a planarity suitable for direct bonding. The process also includes directly bonding the first element to the second element by directly bonding the first dielectric bonding surface to the second dielectric bonding surface. In some embodiments, the process also includes, after providing the second element but before directly bonding the first element to the second element, exposing the second dielectric bonding surface to products of another water vapor plasma. In some embodiments, the process also includes, after directly bonding the first element to the second element, annealing the directly bonded first and second elements to form metallic bonds between the first and second conductive features. In some embodiments, the process also includes, before directly bonding the first element to the second element, positioning the second element over the first element such that the first dielectric bonding surface is facing the second dielectric bonding surface and the first conductive feature is aligned with the second conductive feature. In some embodiments, the first conductive feature is recessed below the first dielectric bonding surface and the second conductive feature is recessed below the second dielectric bonding surface. In some embodiments, before the directly bonded first and second elements are annealed, a distance between the first and second conductive features is 12 nm or less. In some embodiments, annealing the directly bonded first and second elements includes annealing the first and second elements at a temperature less than 250° C. In some embodiments, annealing the first and second elements at a temperature less than 250° C. includes annealing the first and second elements at a temperature less than 200° C. In some embodiments, directly bonding the first dielectric bonding surface to the second dielectric bonding surface includes directly bonding the first and second dielectric bonding surfaces at room temperature. In some embodiments, the process also includes forming a protective layer over a back surface of the first element. The process also includes after directly bonding the first element to the second element, singulating the directly bonded first and second elements into a plurality of bonded dies. In some embodiments, exposing the dielectric bonding surface to the products of the water vapor plasma includes exposing the dielectric bonding surface to the products of a mixture of the water vapor plasma and a carrier gas. In some embodiments, the conductive feature includes copper.

In accordance with another aspect, a process is provided. The process includes providing a first element having a first dielectric bonding surface and a first conductive feature exposed at the first dielectric bonding surface and supplying products of a water vapor plasma to the first element and exposing the first dielectric bonding surface to the products of the water vapor plasma. The process also includes providing a second element having a second dielectric bonding surface and a second conductive feature exposed at the second dielectric bonding surface and directly hybrid bonding the first element to the second element after supplying the products of the water vapor plasma to the first element.

In some embodiments, supplying the products of the water vapor plasma to the first element includes supplying the products of a mixture of water vapor plasma and a carrier gas to the first element. In some embodiments, exposing the first dielectric bonding surface to the products of the water vapor plasma includes supplying water vapor to a plasma generation apparatus without supplying additional reactive species to the plasma generation apparatus. In some embodiments, the process also includes, after providing the second element, supplying products of another water vapor plasma to the second element and exposing the second dielectric bonding surface to the products of the another water vapor plasma. In some embodiments, the process also includes, before supplying the products of the water vapor plasma to the first element, supplying products of an oxygen plasma to the first element to expose the first dielectric bonding surface to the products of the oxygen plasma. In some embodiments, supplying the products of the oxygen plasma to the first element includes supplying products of an oxygen and water vapor plasma to the first element. In some embodiments, supplying the products of the oxygen plasma to the first element includes supplying oxygen gas to a plasma generation apparatus without supplying water vapor to the plasma generation apparatus. In some embodiments, directly hybrid bonding the first element to the second element includes room temperature bonding the first dielectric bonding surface to the second dielectric bonding surface to form an initial bonded structure and subsequently annealing the initial bonded structure to form metallic bonds between the first and second conductive features.

In accordance with another aspect, a method of forming a bonded structure is provided. The method includes exposing a surface of a first element to products of a water vapor plasma and directly bonding the surface of the first element to a bonding surface of a second element.

In some embodiments, the surface includes a first non-conductive field region and a first conductive feature, and wherein the bonding surface of the second element includes a second non-conductive field region and a second conductive feature. In some embodiments, directly bonding the surface of the first element to the bonding surface of the second element includes directly hybrid bonding. In some embodiments, the method also includes, after exposing the surface of the first element to the water vapor plasma, drying the surface of the first element. In some embodiments, the method also includes, before directly bonding the surface of the first element to the bonding surface of the second element, exposing the bonding surface of the second element to products of another water vapor plasma. In some embodiments, directly bonding the surface of the first element to the bonding surface of the second element includes annealing the directly bonded first and second elements to form metallic bonds between conductive features on the first and second elements. In some embodiments, annealing the directly bonded first and second elements includes annealing the first and second elements at a temperature less than 200° C.

In accordance with another aspect, a method of forming a bonded structure is provided. The method includes exposing a first bonding surface of a first element to products of a water vapor plasma and directly bonding the first bonding surface to a second bonding surface of a second element.

In some embodiments, the first bonding surface includes a first non-conductive field region and a first conductive feature and wherein the second bonding surface includes a second non-conductive field region and a second conductive feature.

Unless the context clearly requires otherwise, throughout the description and the claims, the words "comprise." "comprising." "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above." "below." and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might." "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A process, comprising:
- providing an element having a dielectric bonding surface and a conductive feature exposed at the dielectric bonding surface, the dielectric bonding surface having a planarity suitable for direct bonding;
- generating a water vapor plasma with a plasma generation apparatus by supplying water vapor to the plasma generating apparatus; and
- exposing the dielectric bonding surface to products of a mixture of the water vapor plasma and a carrier gas prior to direct bonding.

2. The process of claim 1 wherein the element comprises a first element, the dielectric bonding surface comprises a first dielectric bonding surface, and the conductive feature comprises a first conductive feature, the process further comprising:
- providing a second element having a second dielectric bonding surface and a second conductive feature exposed at the second dielectric bonding surface, wherein the second dielectric bonding surface has a planarity suitable for direct bonding; and
- directly bonding the first element to the second element by directly bonding the first dielectric bonding surface to the second dielectric bonding surface.

3. The process of claim 2, further comprising:
- after directly bonding the first element to the second element, annealing the directly bonded first and second elements to form metallic bonds between the first and second conductive features.

4. The process of claim 3, further comprising:
- before directly bonding the first element to the second element, positioning the second element over the first element such that the first dielectric bonding surface is facing the second dielectric bonding surface and the first conductive feature is aligned with the second conductive feature.

5. The process of claim 4, wherein the first conductive feature is recessed below the first dielectric bonding surface and the second conductive feature is recessed below the second dielectric bonding surface.

6. The process of claim 5, wherein, before annealing the directly bonded first and second elements, a distance between the first and second conductive features is 12 nm or less.

7. The process of claim 6, wherein annealing the directly bonded first and second elements comprises annealing the first and second elements at a temperature less than 200° C.

8. The process of claim 2, further comprising:
- forming a protective layer over a back surface of the first element; and after directly bonding the first element to the second element, singulating the directly bonded first and second elements into a plurality of bonded dies.

9. The process of claim 1, wherein the conductive feature comprises copper.

10. A process, comprising:

providing a first element having a first dielectric bonding surface and a first conductive feature exposed at the first dielectric bonding surface;

supplying products of an oxygen plasma to the first element to expose the first dielectric bonding surface to the products of the oxygen plasma;

after supplying the products of the oxygen plasma to the first element, supplying products of a water vapor plasma to the first element and exposing the first dielectric bonding surface to the products of the water vapor plasma;

providing a second element having a second dielectric bonding surface and a second conductive feature exposed at the second dielectric bonding surface; and directly hybrid bonding the first element to the second element after supplying the products of the water vapor plasma to the first element, wherein directly hybrid bonding comprises room temperature bonding the first dielectric bonding surface to the second dielectric bonding surface to form an initial bonded structure and subsequently annealing the initial bonded structure to form metallic bonds between the first and second conductive features.

11. The process of claim 10, wherein supplying the products of the water vapor plasma to the first element comprises supplying the products of a mixture of the water vapor plasma and a carrier gas to the first element.

12. The process of claim 10, wherein supplying the products of the water vapor plasma to the first element comprises supplying water vapor to a plasma generation apparatus without supplying additional reactive species to the plasma generation apparatus.

13. A method of forming a bonded structure, the method comprising:

supplying water vapor and oxygen to a plasma generation apparatus to generate a plasma;

exposing a surface of a first element to products the plasma; and directly bonding the surface of the first element to a bonding surface of a second element.

14. The method of claim 13, wherein the surface comprises a first non-conductive field region and a first conductive feature, and wherein the bonding surface of the second element comprises a second non-conductive field region and a second conductive feature.

15. The method of claim 14, wherein directly bonding the surface of the first element to the bonding surface of the second element comprises directly hybrid bonding.

16. The method of claim 13, further comprising:

before directly bonding the surface of the first element to the bonding surface of the second element, exposing the bonding surface of the second element to products of a water vapor plasma.

17. The method of claim 13, wherein directly bonding the surface of the first element to the bonding surface of the second element comprises annealing the directly bonded first and second elements to form metallic bonds between conductive features on the first and second elements.

18. The method of claim 17, wherein annealing the directly bonded first and second elements comprises annealing the first and second elements at a temperature less than 200° C.

* * * * *